US010395730B2

(12) United States Patent
Mori et al.

(10) Patent No.: US 10,395,730 B2
(45) Date of Patent: Aug. 27, 2019

(54) NON-VOLATILE MEMORY DEVICE WITH VARIABLE READOUT REFERENCE

(71) Applicant: Sony Semiconductor Solutions Corporation, Kanagawa (JP)

(72) Inventors: Yotaro Mori, Kanagawa (JP); Makoto Kitagawa, Chiba (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 15/516,527

(22) PCT Filed: Sep. 29, 2015

(86) PCT No.: PCT/JP2015/077436
§ 371 (c)(1),
(2) Date: Apr. 3, 2017

(87) PCT Pub. No.: WO2016/067805
PCT Pub. Date: May 6, 2016

(65) Prior Publication Data
US 2018/0025778 A1 Jan. 25, 2018

(30) Foreign Application Priority Data
Oct. 30, 2014 (JP) .................................. 2014-220979

(51) Int. Cl.
*G11C 11/00* (2006.01)
*G11C 13/00* (2006.01)
*G11C 5/14* (2006.01)

(52) U.S. Cl.
CPC .......... *G11C 13/0002* (2013.01); *G11C 5/147* (2013.01); *G11C 13/004* (2013.01);
(Continued)

(58) Field of Classification Search
CPC .................................................. G11C 13/0002
(Continued)

(56) References Cited

U.S. PATENT DOCUMENTS

2003/0202407 A1* 10/2003 Hidaka .................. G11C 11/15
365/200
2010/0214820 A1* 8/2010 Hosono .................... G11C 8/14
365/148
2014/0211549 A1* 7/2014 Lin ..................... G11C 11/1675
365/158

FOREIGN PATENT DOCUMENTS

JP   2001-243760 A   9/2001
JP   2009-211735 A   9/2009
(Continued)

*Primary Examiner* — Hoai V Ho
(74) *Attorney, Agent, or Firm* — Michael Best & Friedrich LLP

(57) ABSTRACT

A non-volatile memory device of the present disclosure includes: a plurality of bit lines; a plurality of word lines; a memory cell array having a plurality of memory cells each including a non-volatile storage element and being disposed at crossing sections of the bit lines and the word lines; a reference voltage generator circuit that generates a readout reference voltage serving as a reference for discrimination of data values stored on the memory cells; a readout circuit that reads the data values stored on the memory cells by detecting values of readout voltages from the memory cells relative to the readout reference voltage in a state where a predetermined current-limited readout current is applied to the bit lines; and an address compensation circuit that changes the readout reference voltage in accordance with a placement position of a memory cell to be read of the memory cells in the readout circuit.

15 Claims, 28 Drawing Sheets

(52) U.S. Cl.
CPC ...... *G11C 13/0023* (2013.01); *G11C 13/0061* (2013.01); *G11C 2013/0042* (2013.01); *G11C 2013/0045* (2013.01); *G11C 2013/0054* (2013.01); *G11C 2213/15* (2013.01); *G11C 2213/72* (2013.01); *G11C 2213/79* (2013.01)

(58) Field of Classification Search
USPC ........................................................ 365/148
See application file for complete search history.

(56) References Cited

FOREIGN PATENT DOCUMENTS

| | | |
|---|---|---|
| JP | 2011-054232 A | 3/2011 |
| WO | WO-2012/032775 A1 | 3/2012 |

\* cited by examiner

[ FIG. 1 ]
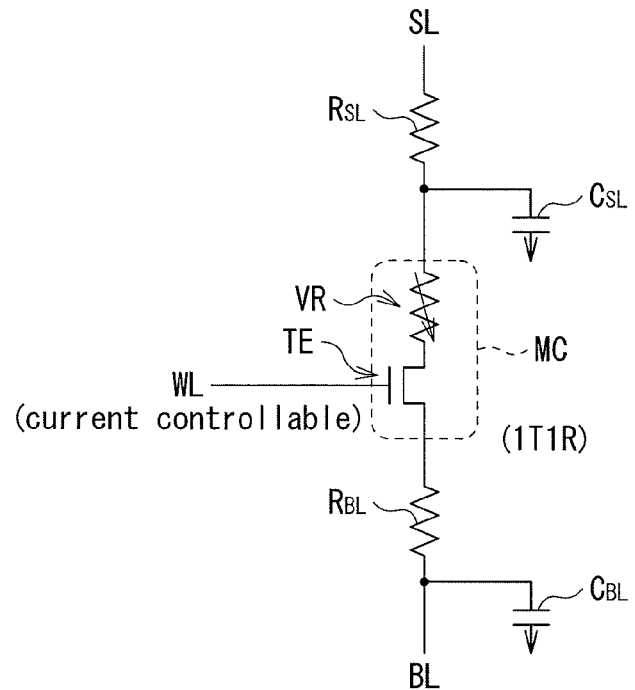
[ FIG. 2 ]
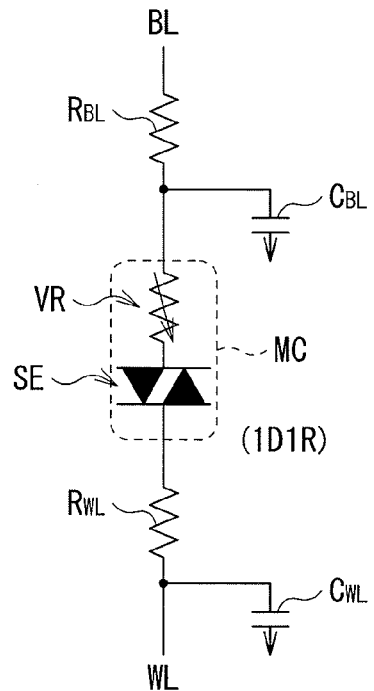

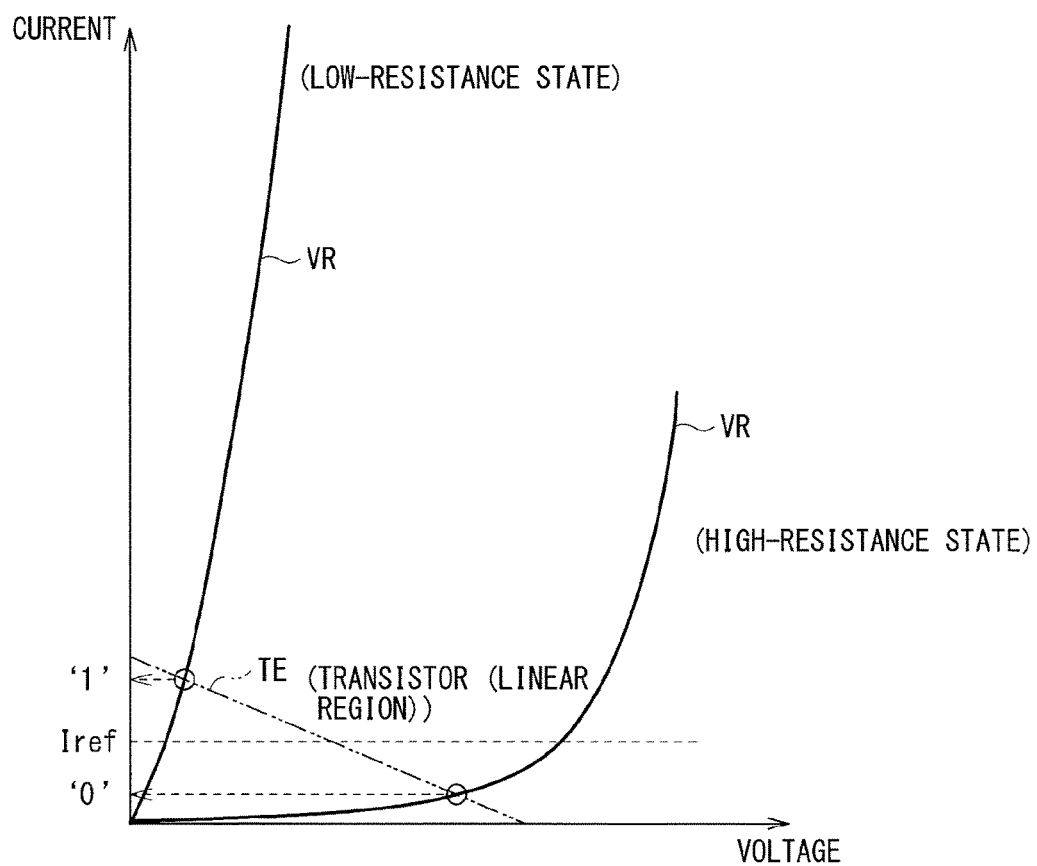

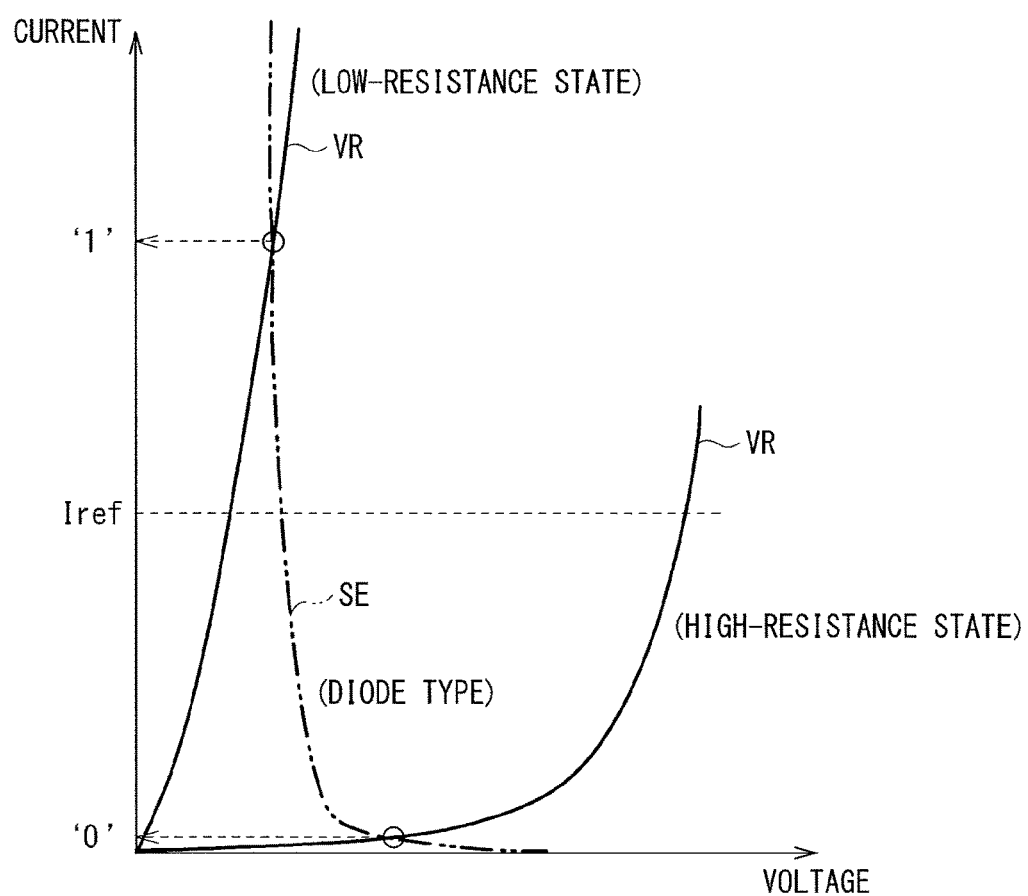

[ FIG. 5 ]
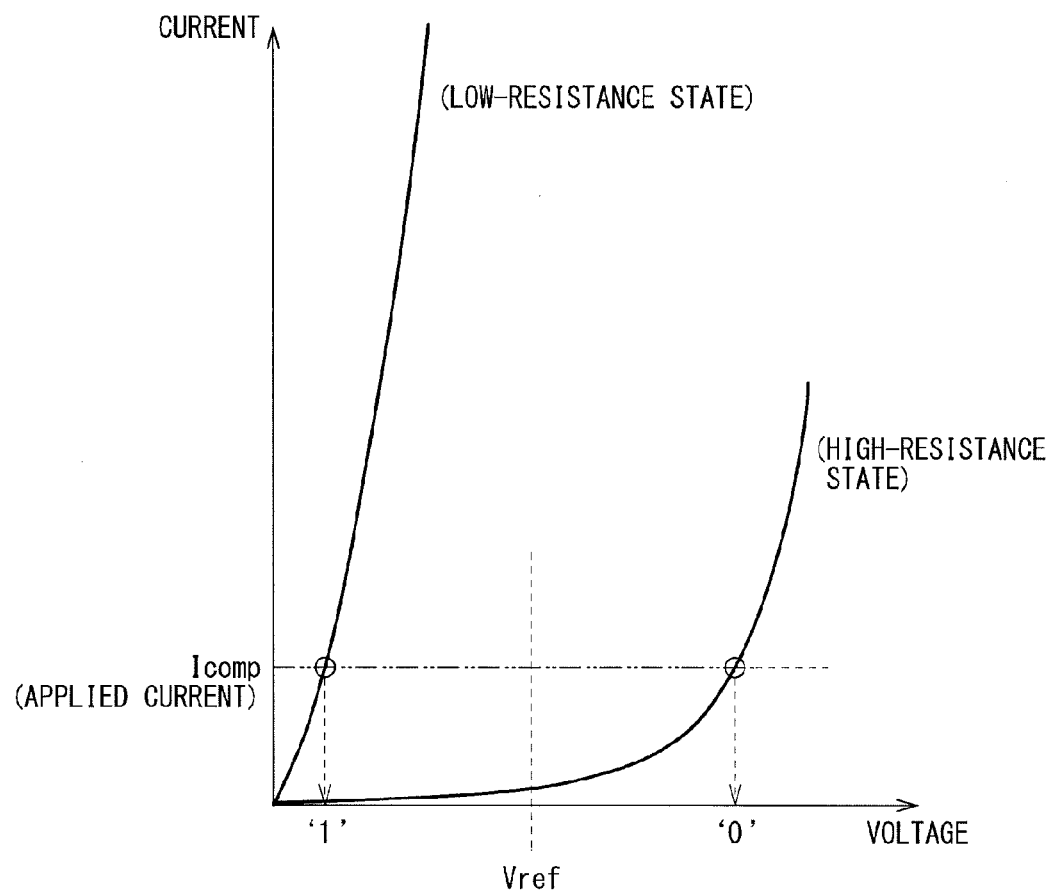

[ FIG. 6 ]
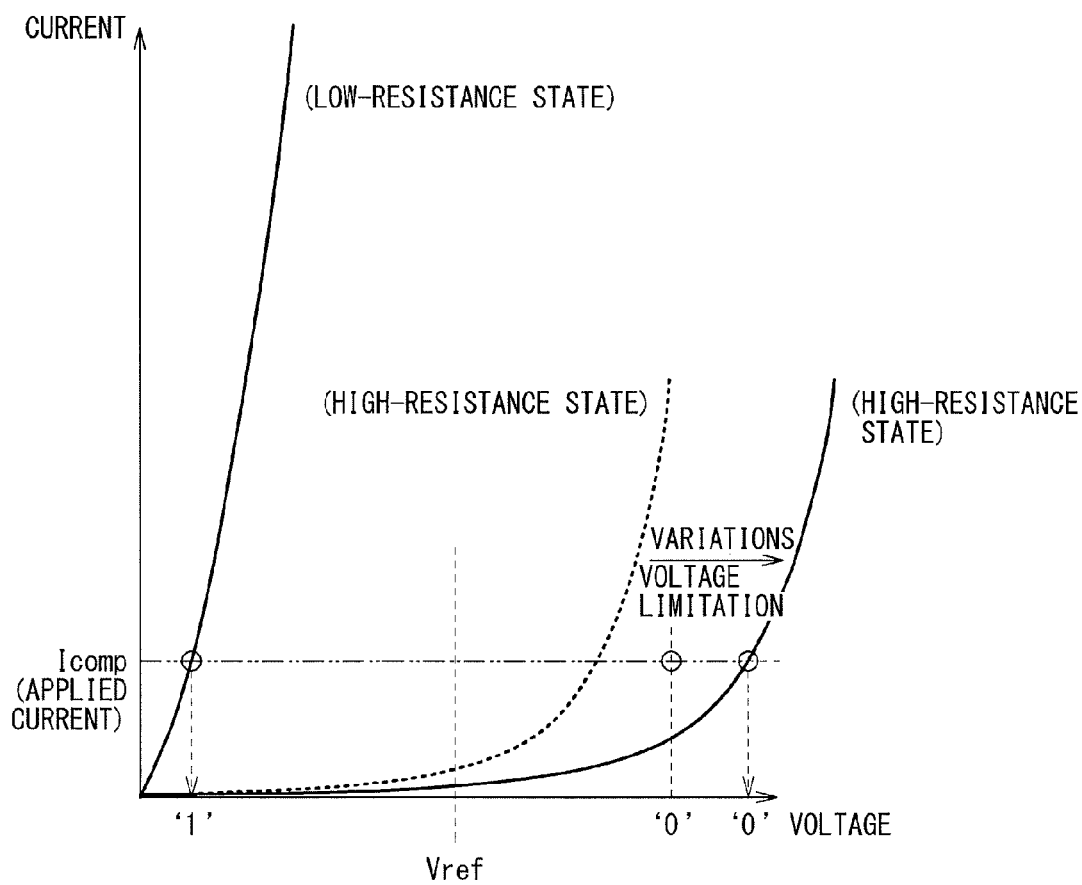

[ FIG. 7 ]
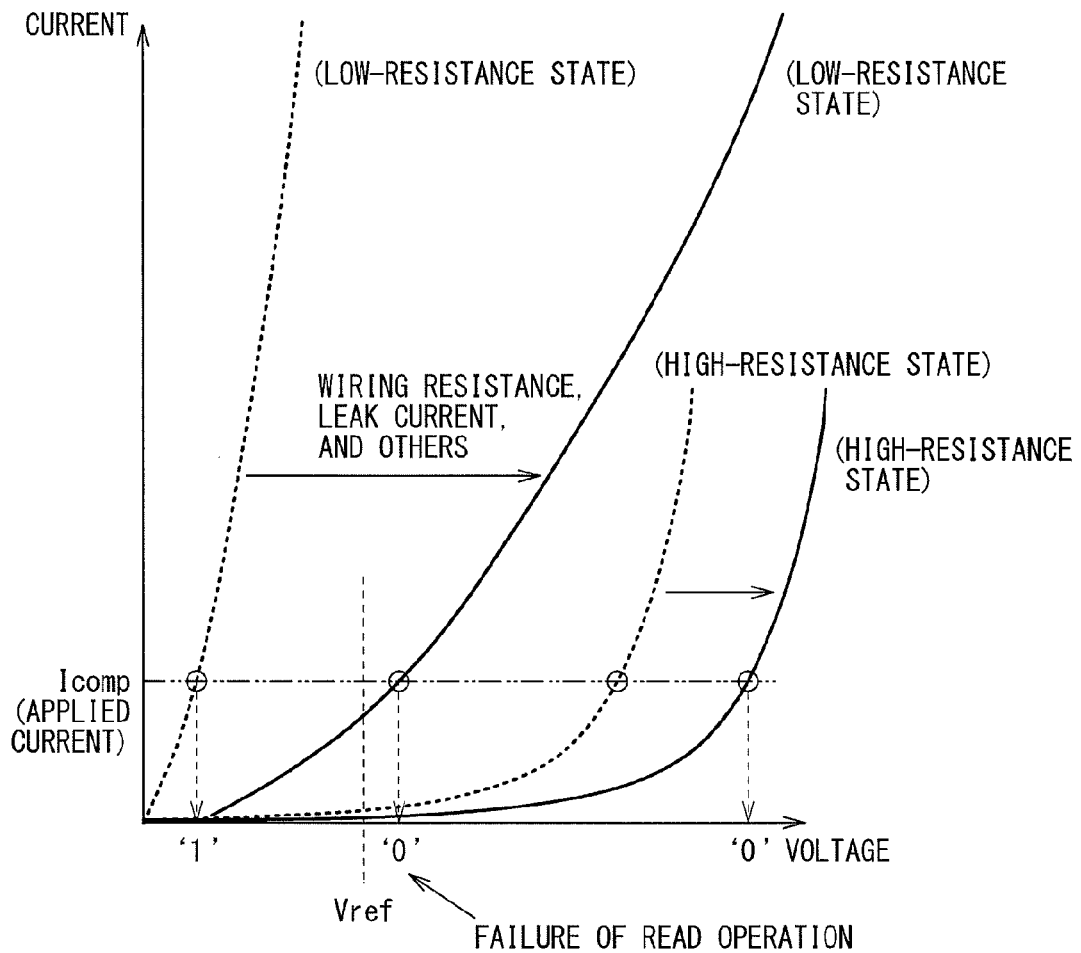

[ FIG. 8 ]
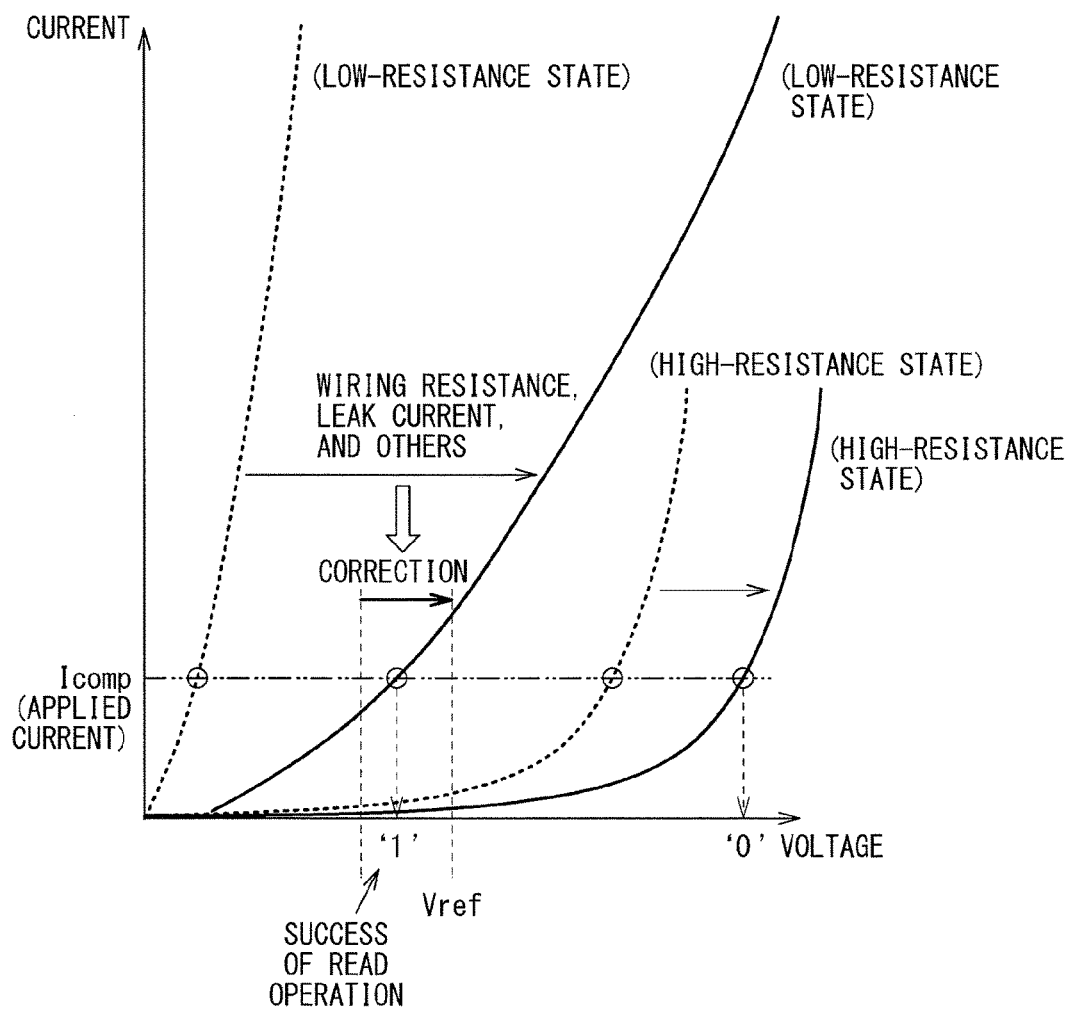

[FIG. 9]
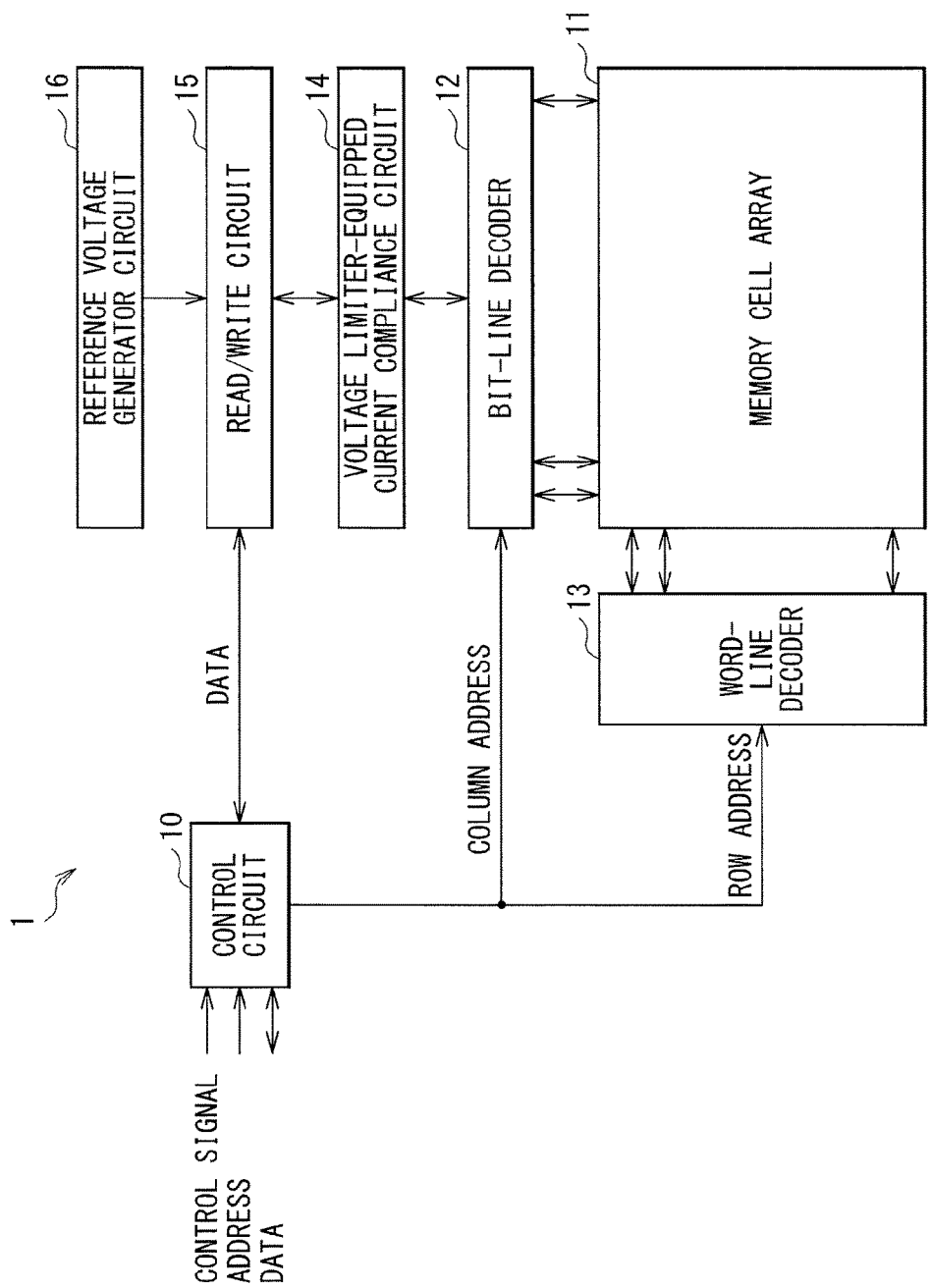

[ FIG. 10 ]
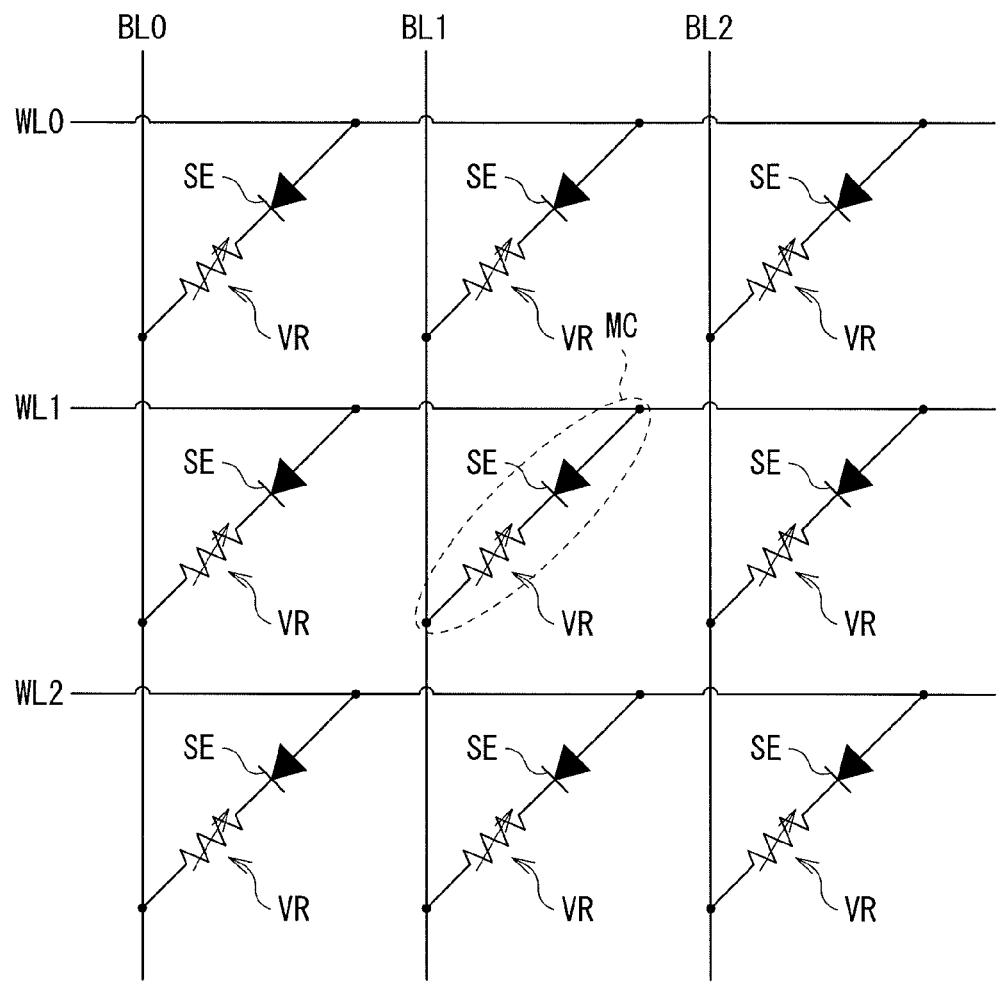

[ FIG. 11 ]
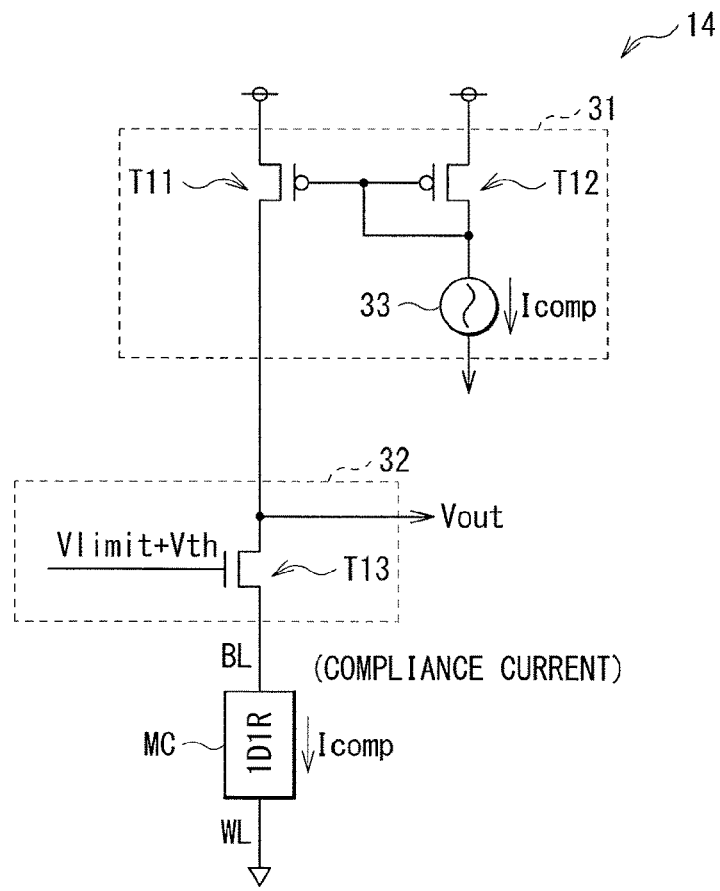
[ FIG. 12 ]
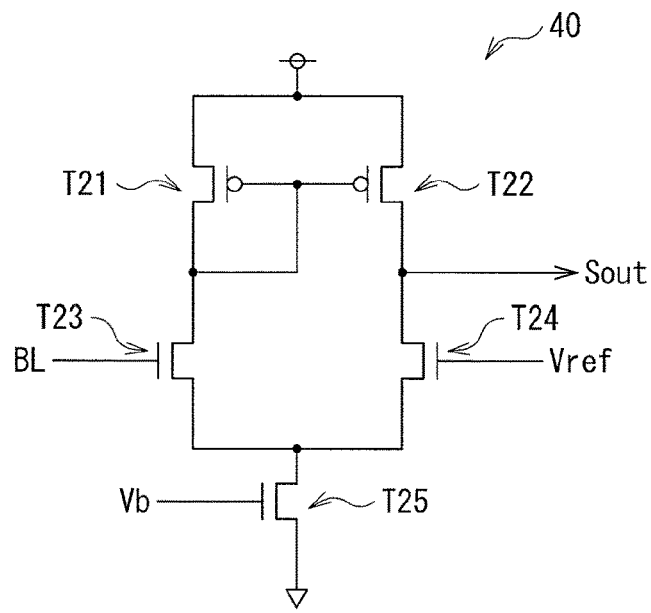

[ FIG. 13 ]
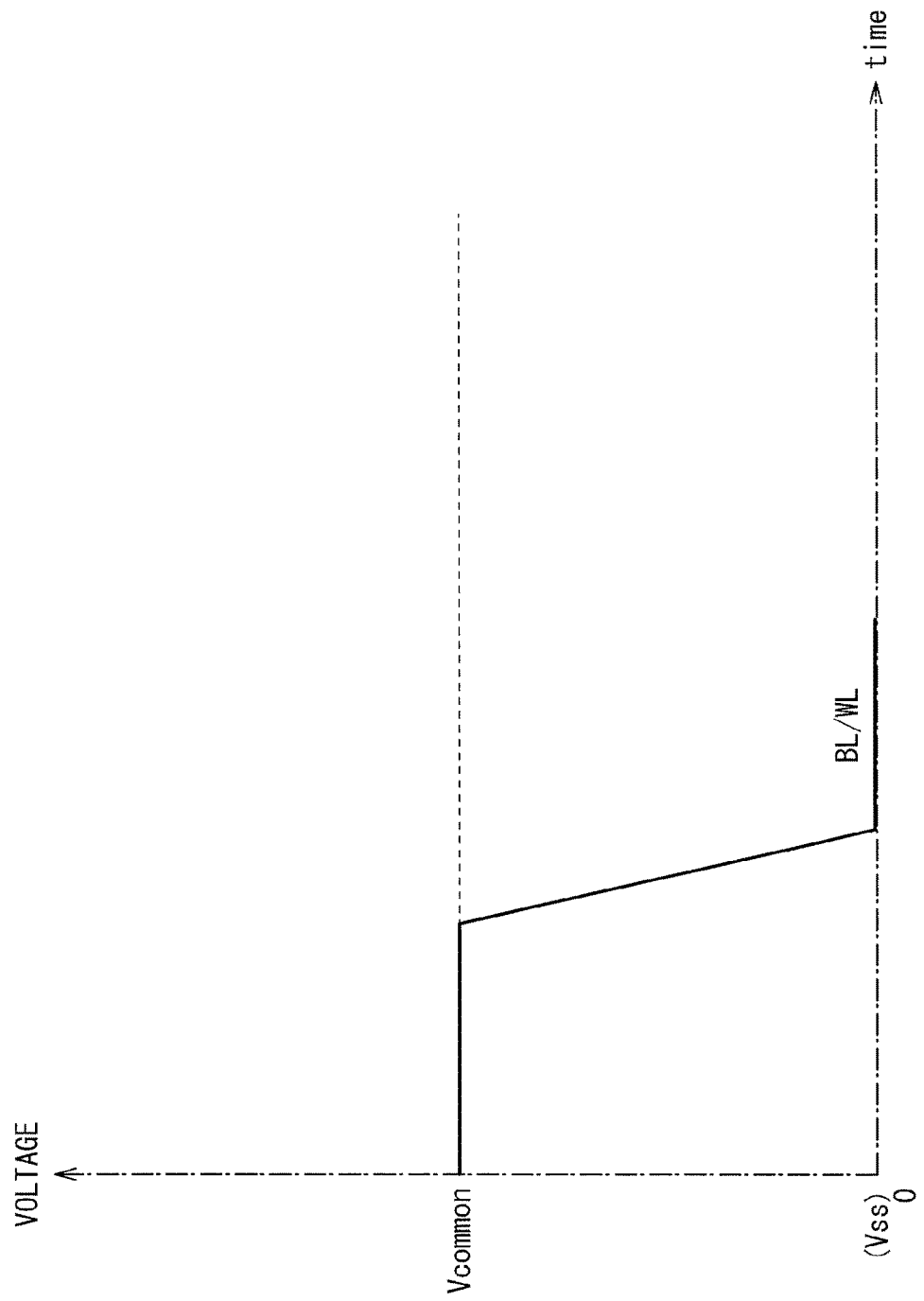

[ FIG. 14 ]
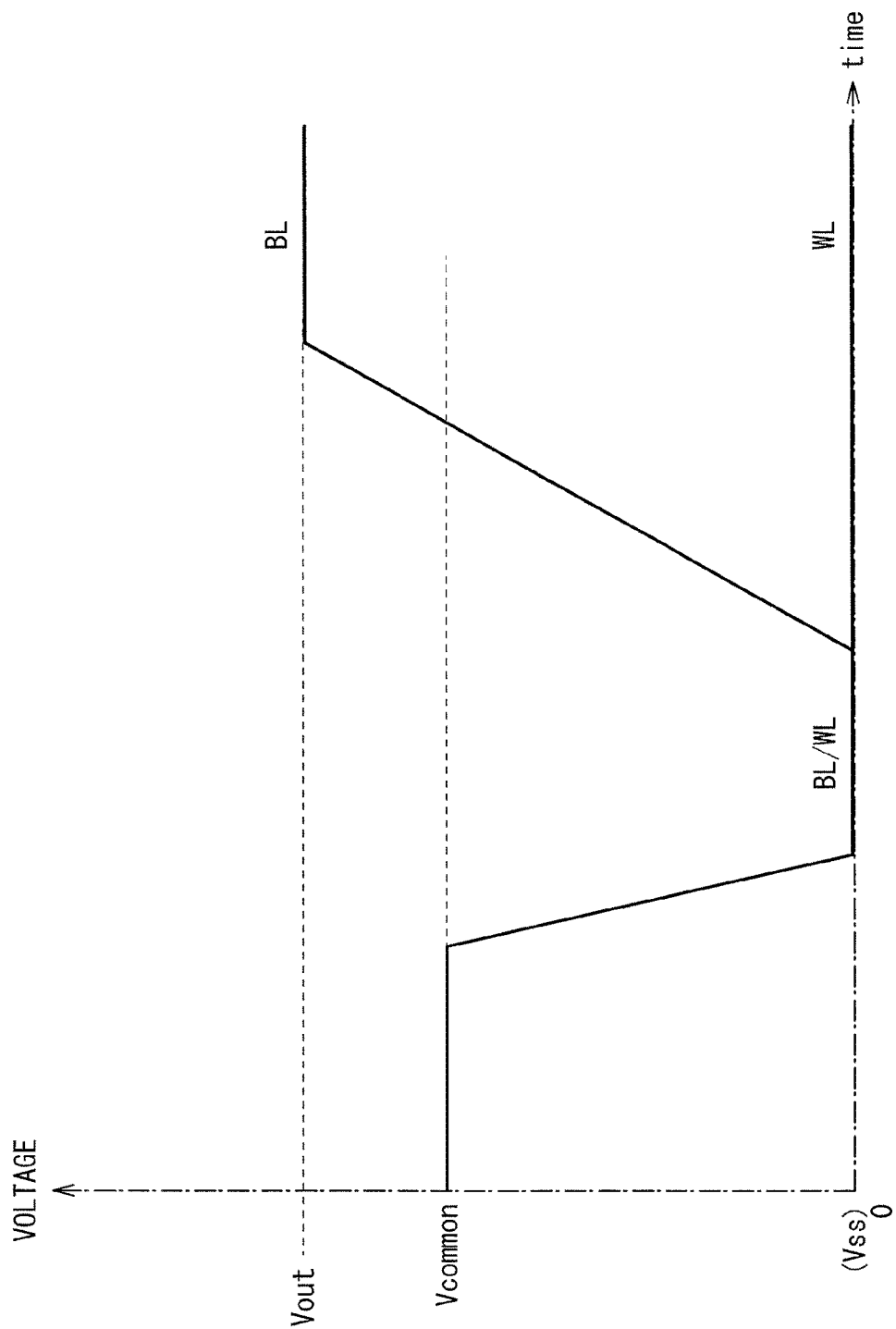

[ FIG. 15 ]
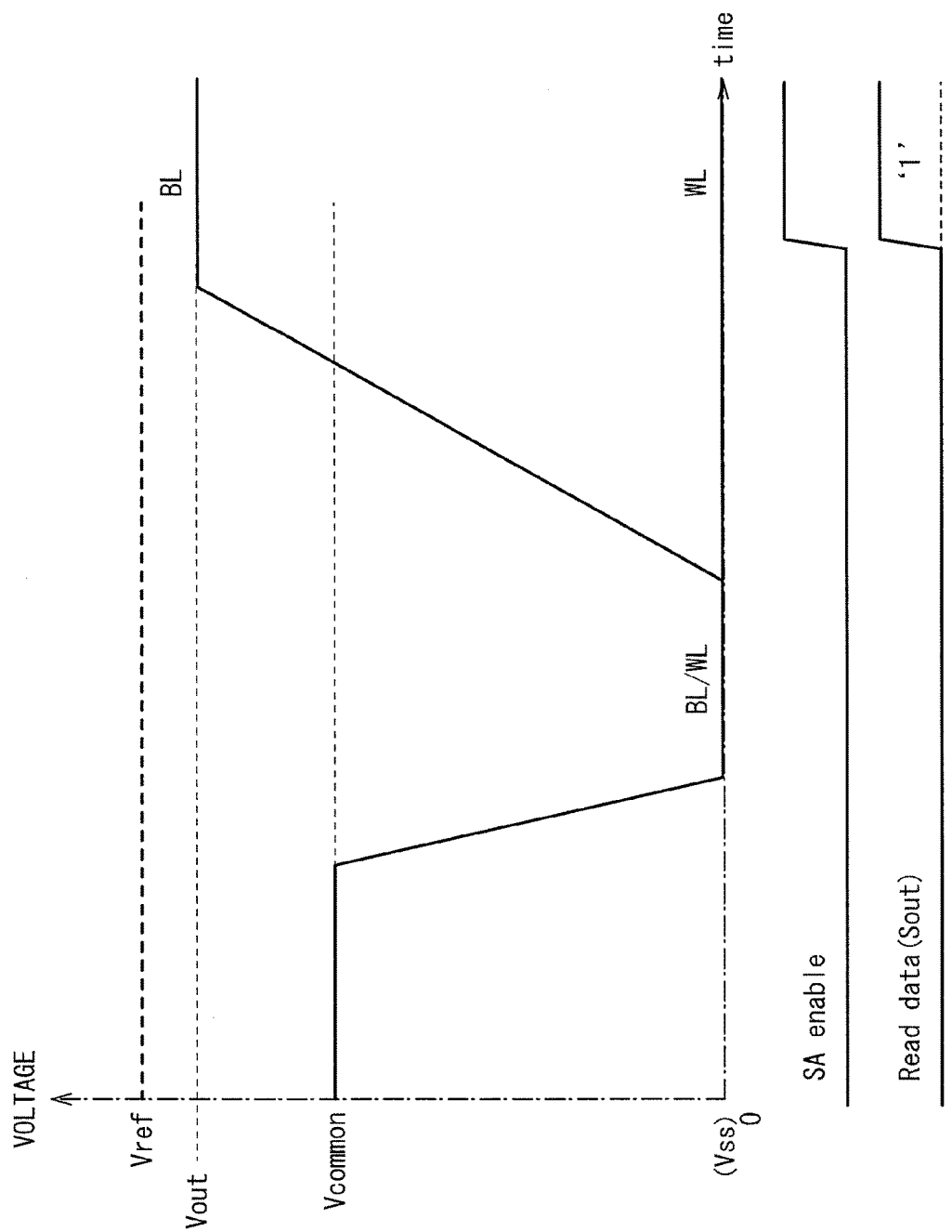

[ FIG. 16 ]
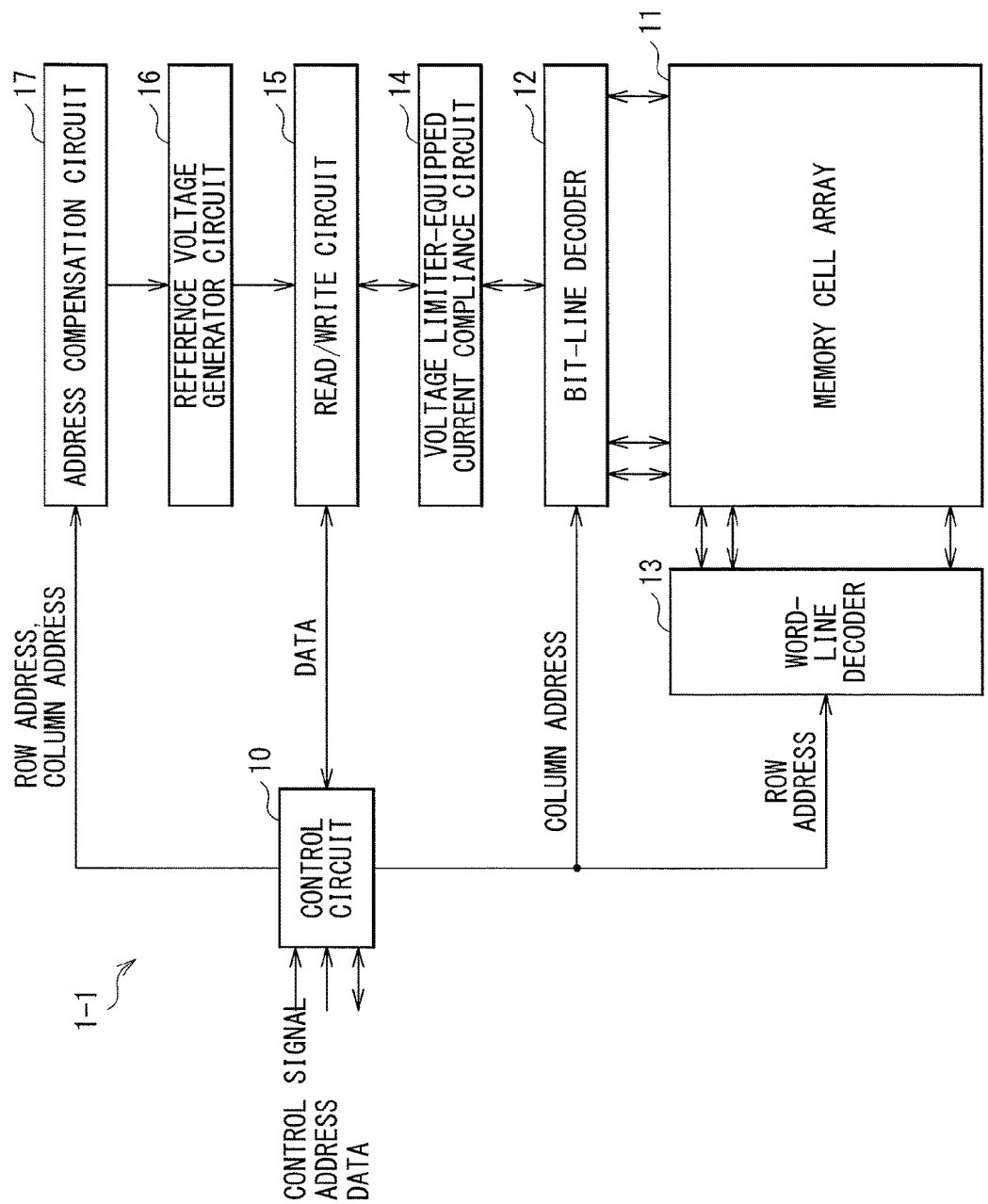

[ FIG. 17 ]
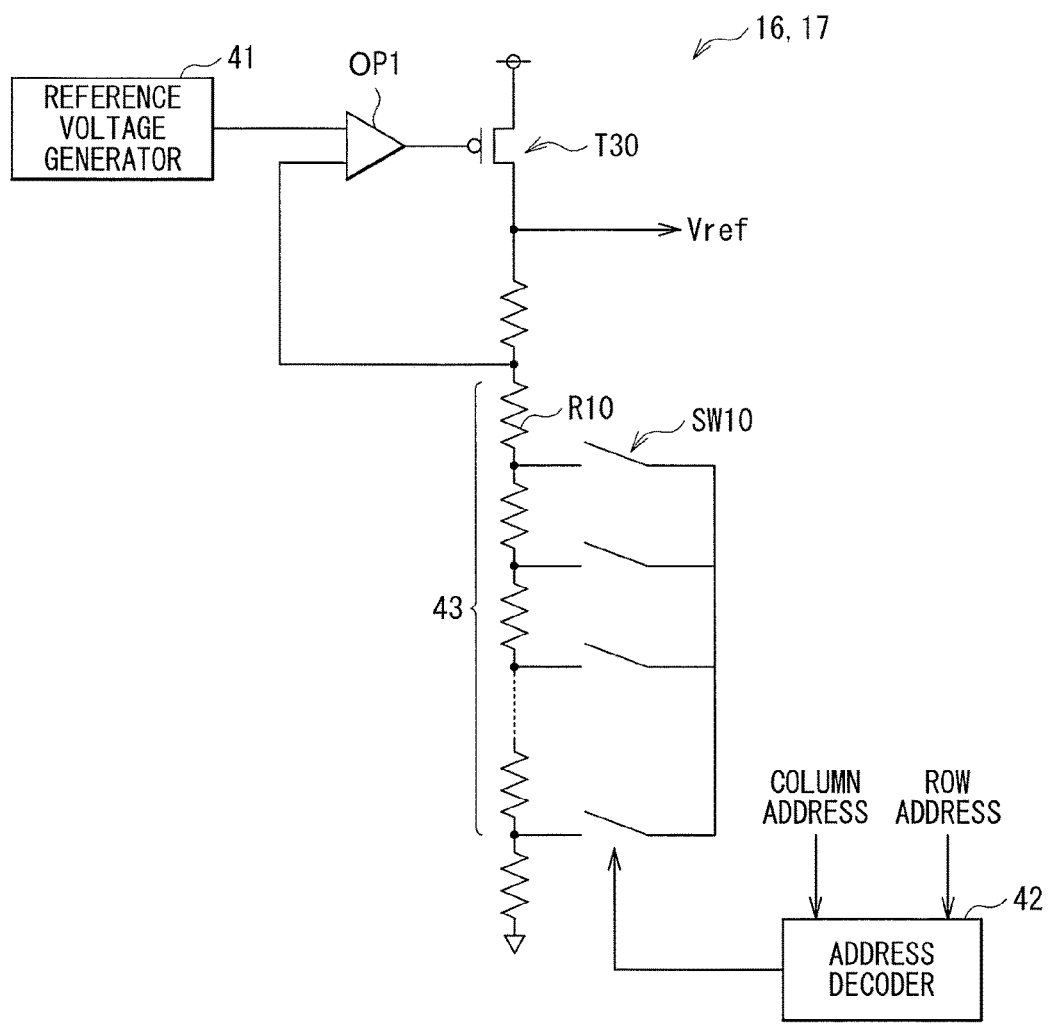

[ FIG. 18 ]
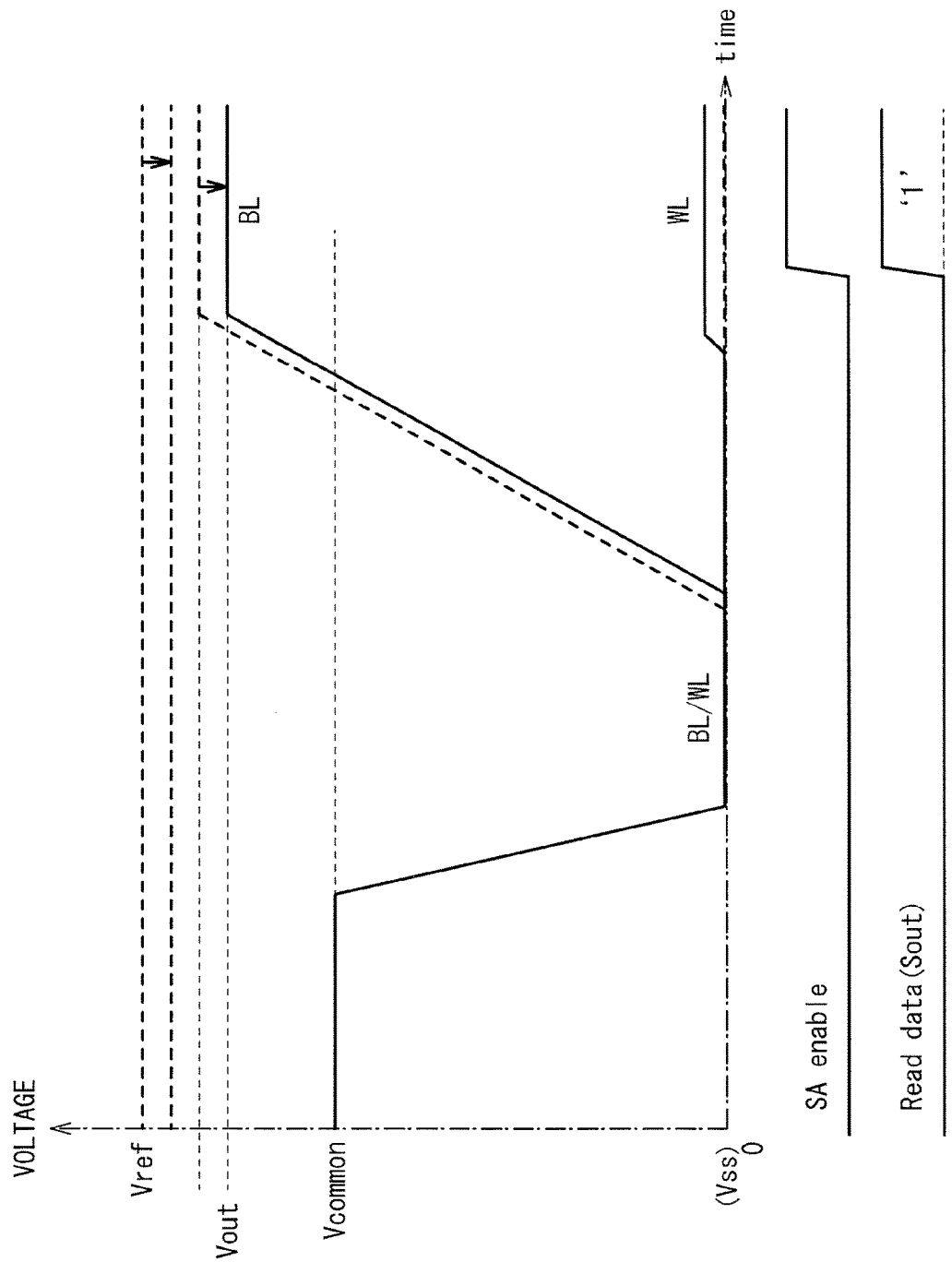

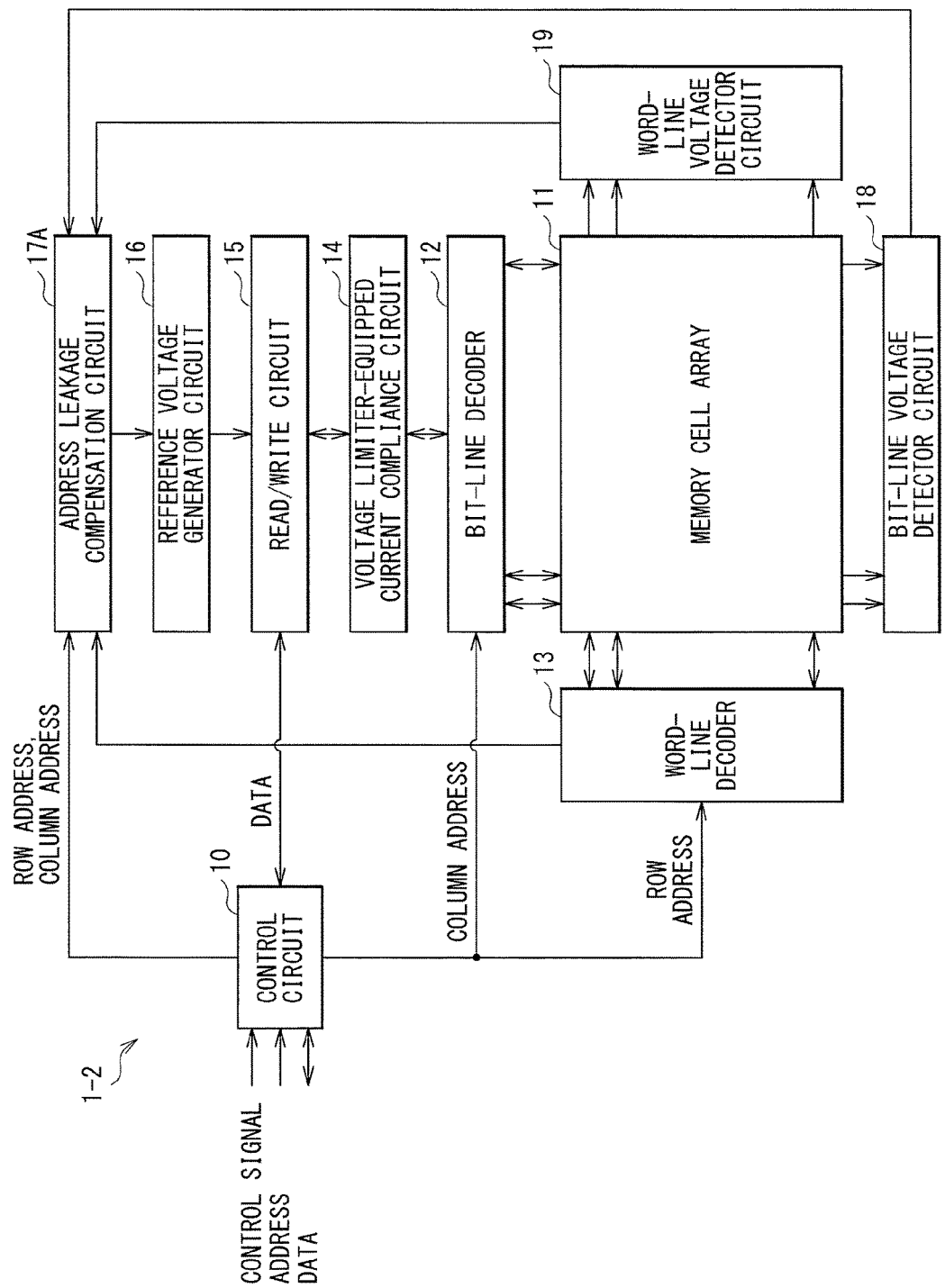
[ FIG. 19 ]

[ FIG. 20 ]
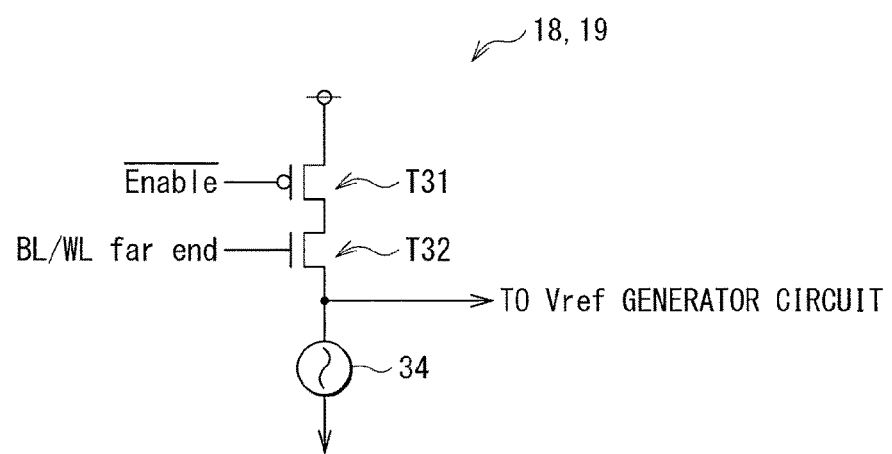

[ FIG. 21 ]
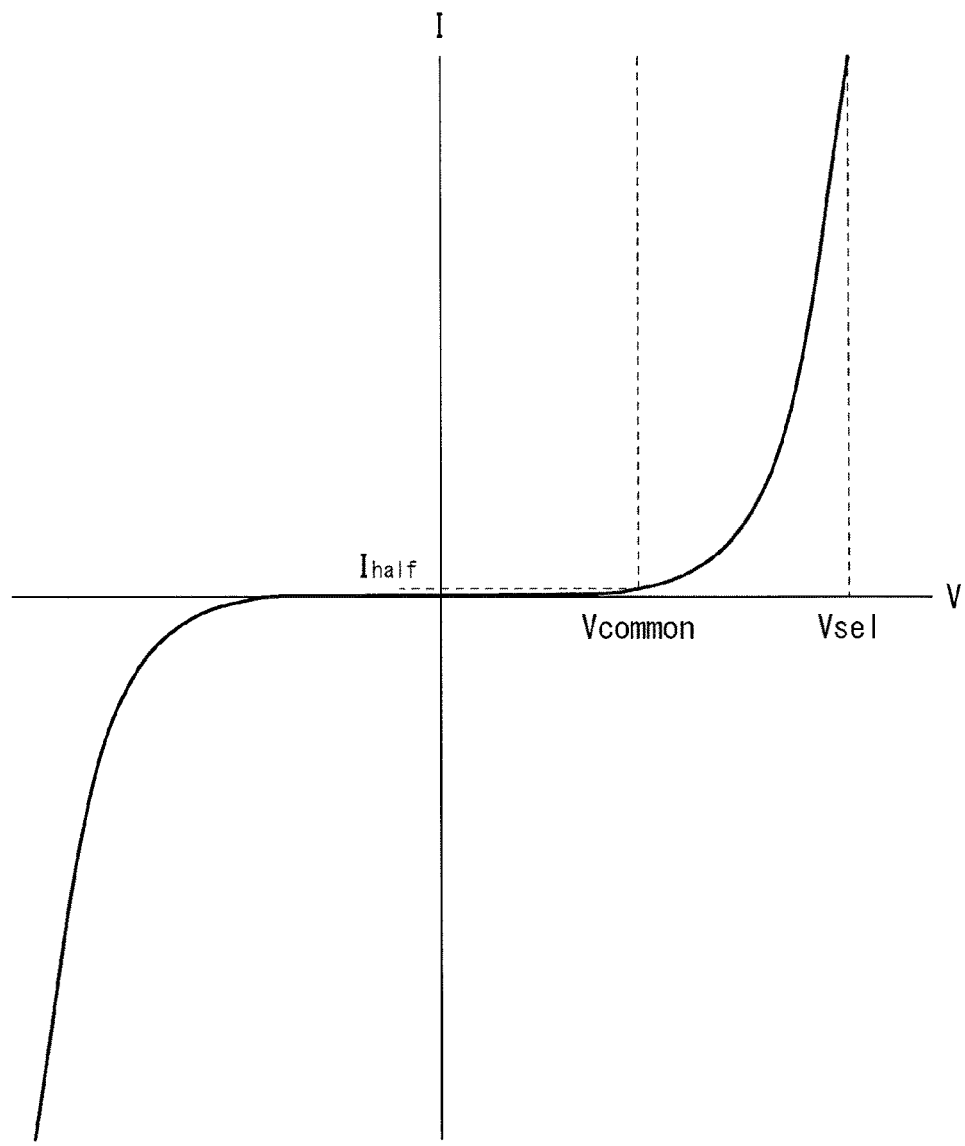

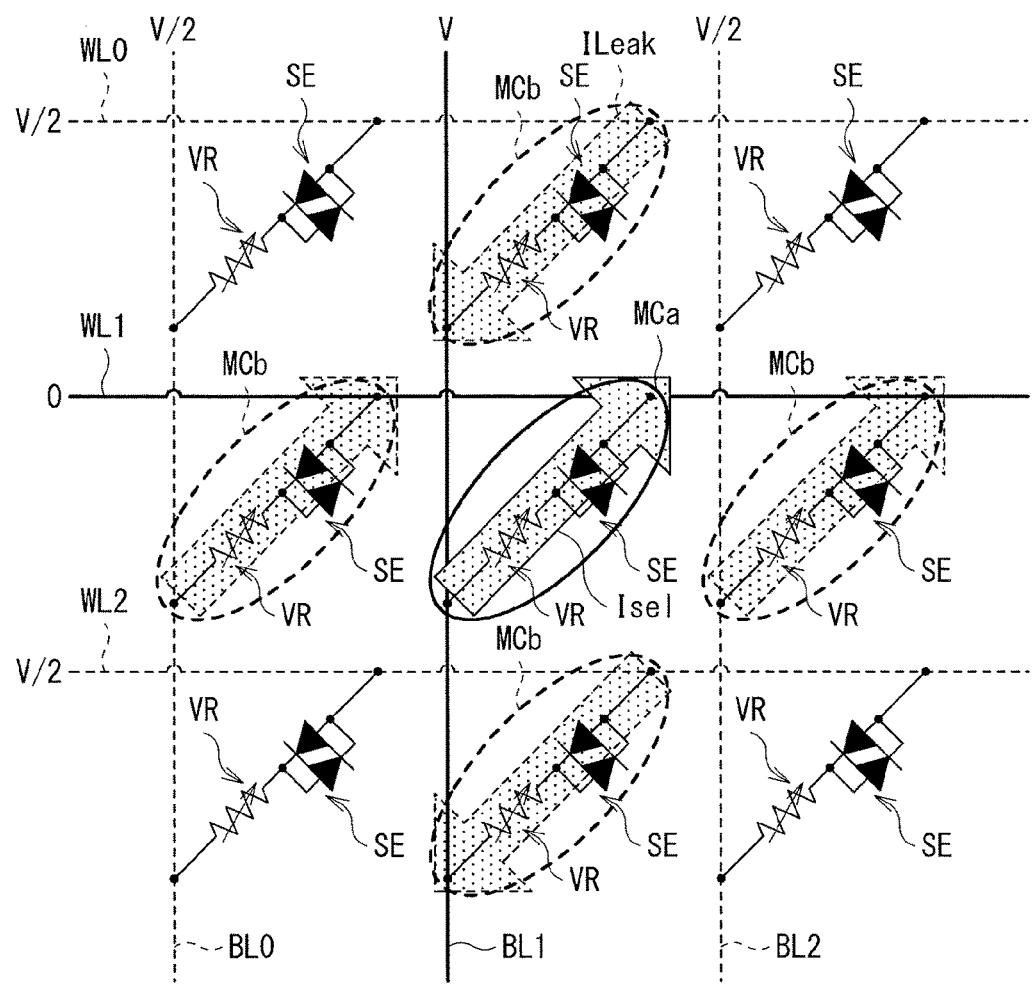
[FIG. 22]

[FIG. 23]
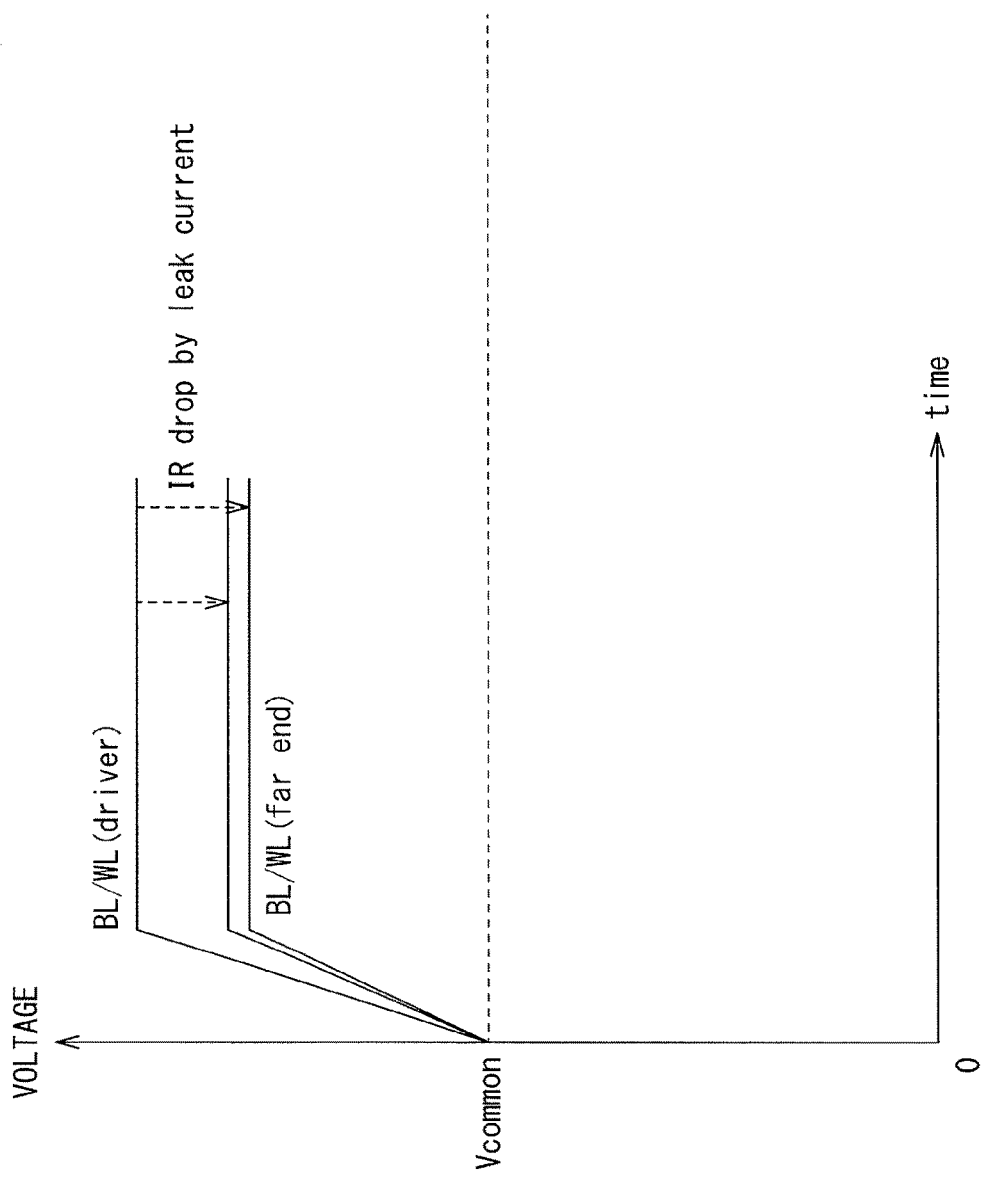

[ FIG. 24 ]
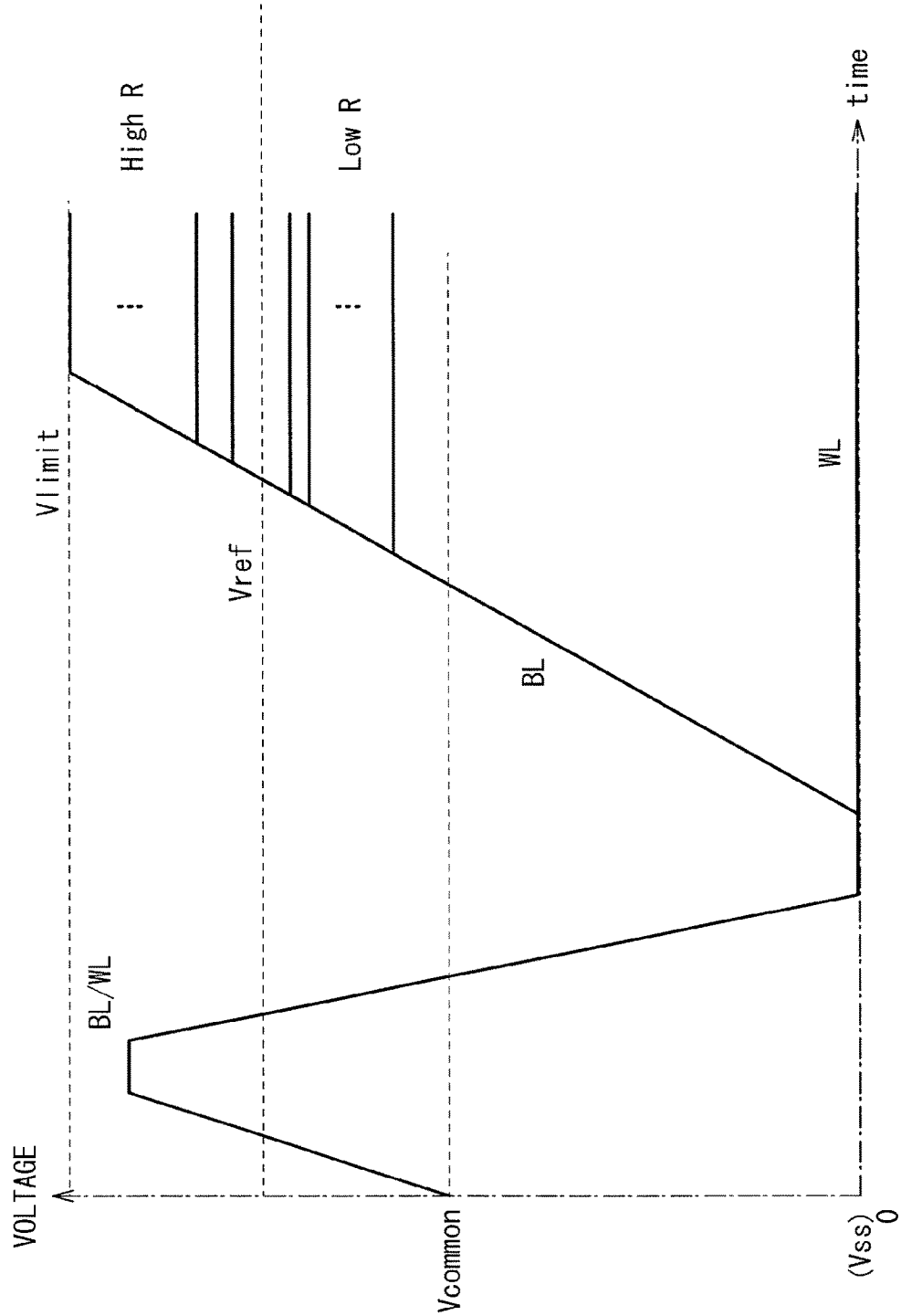

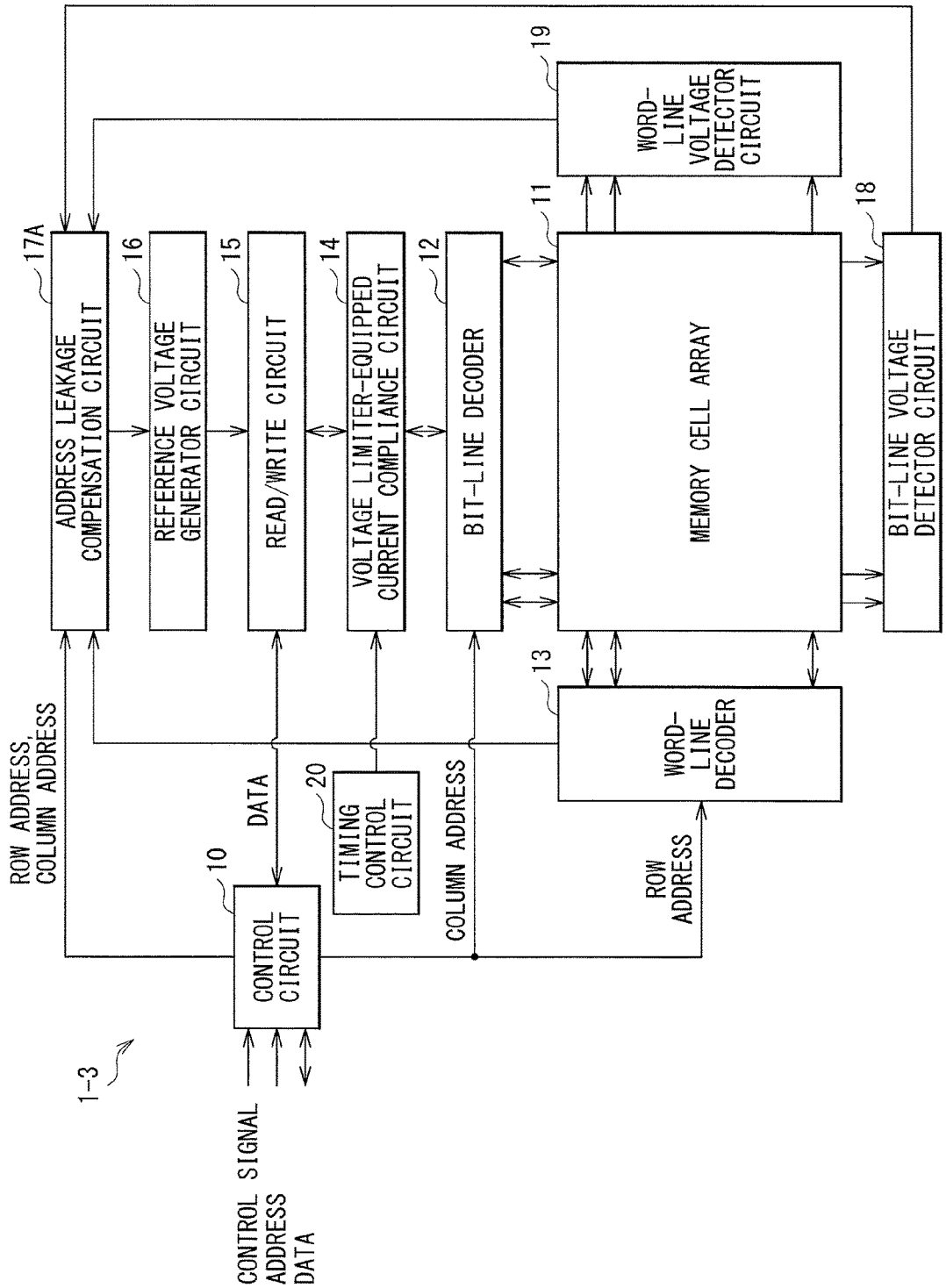
[ FIG. 25 ]

[ FIG. 26 ]
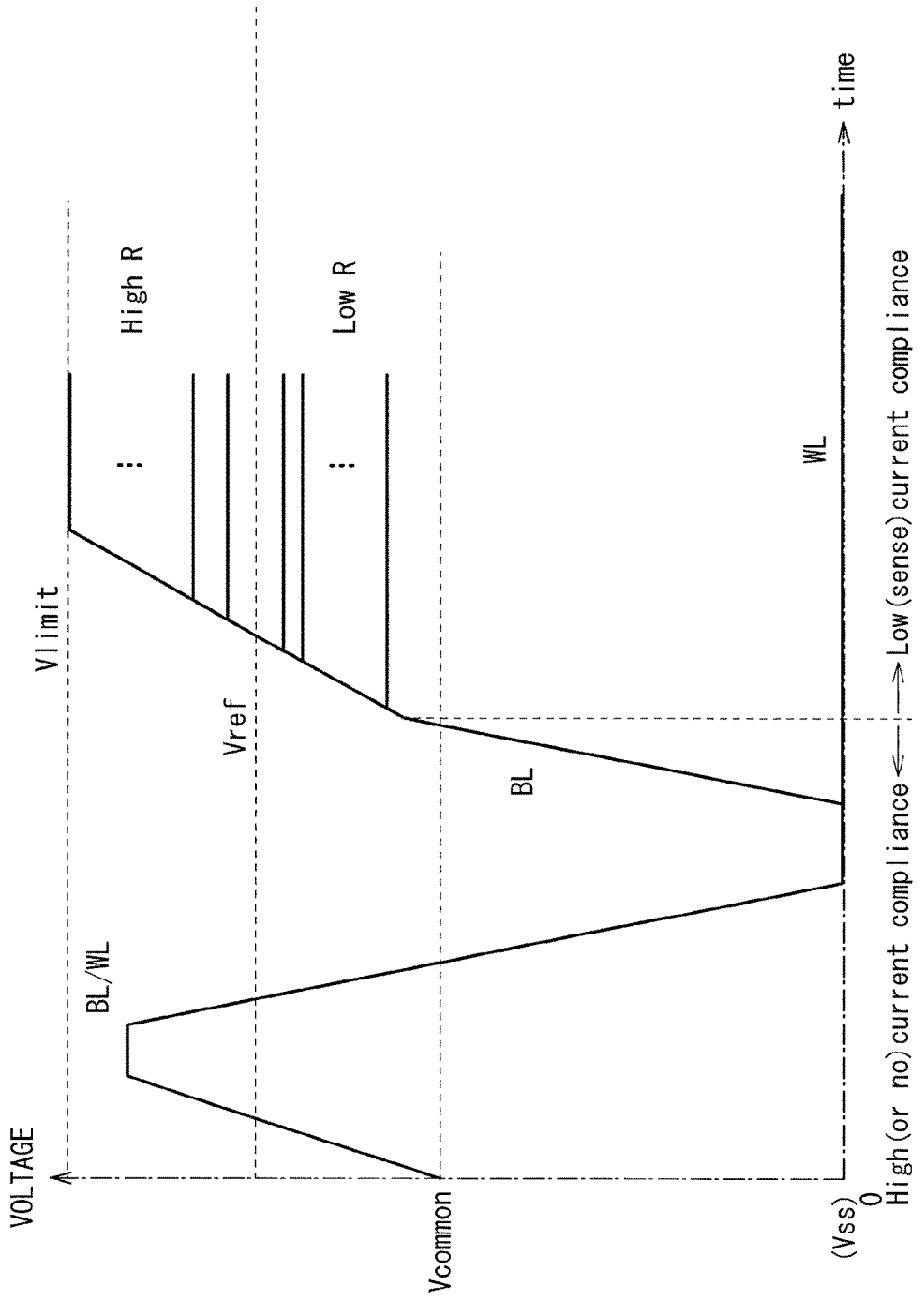

[ FIG. 27 ]
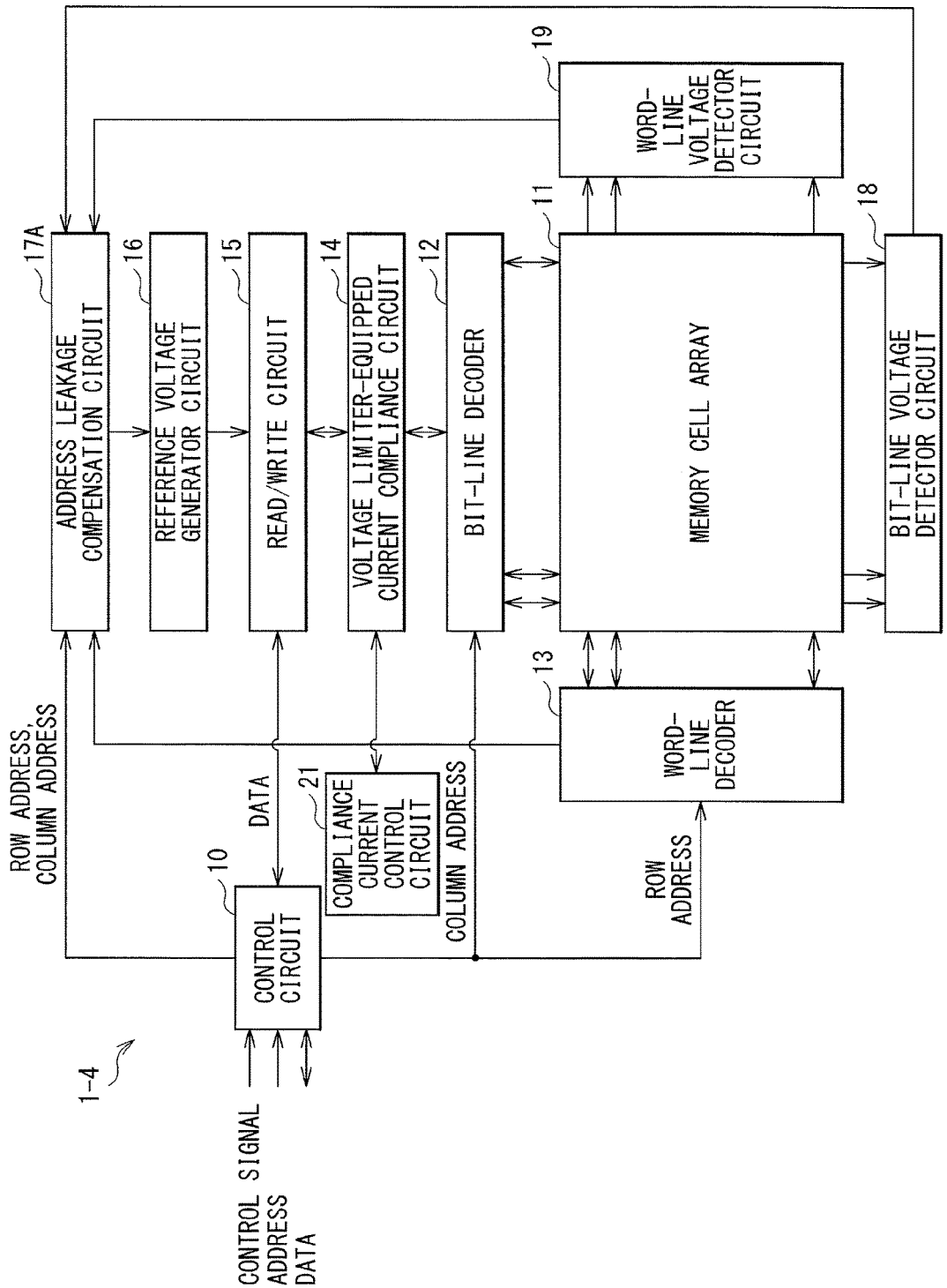

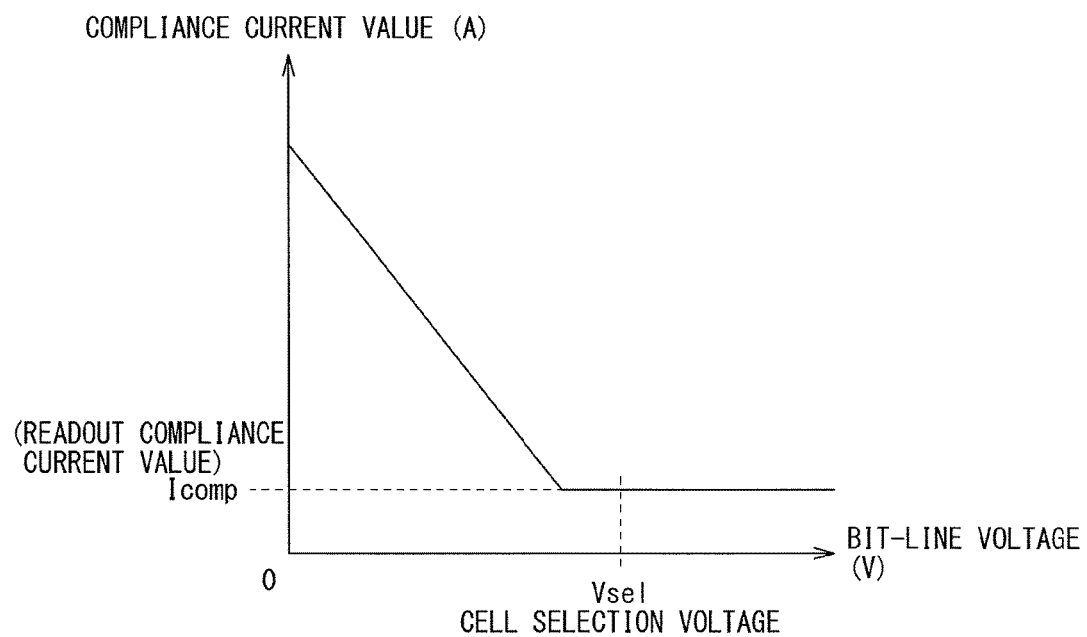
[ FIG. 28 ]

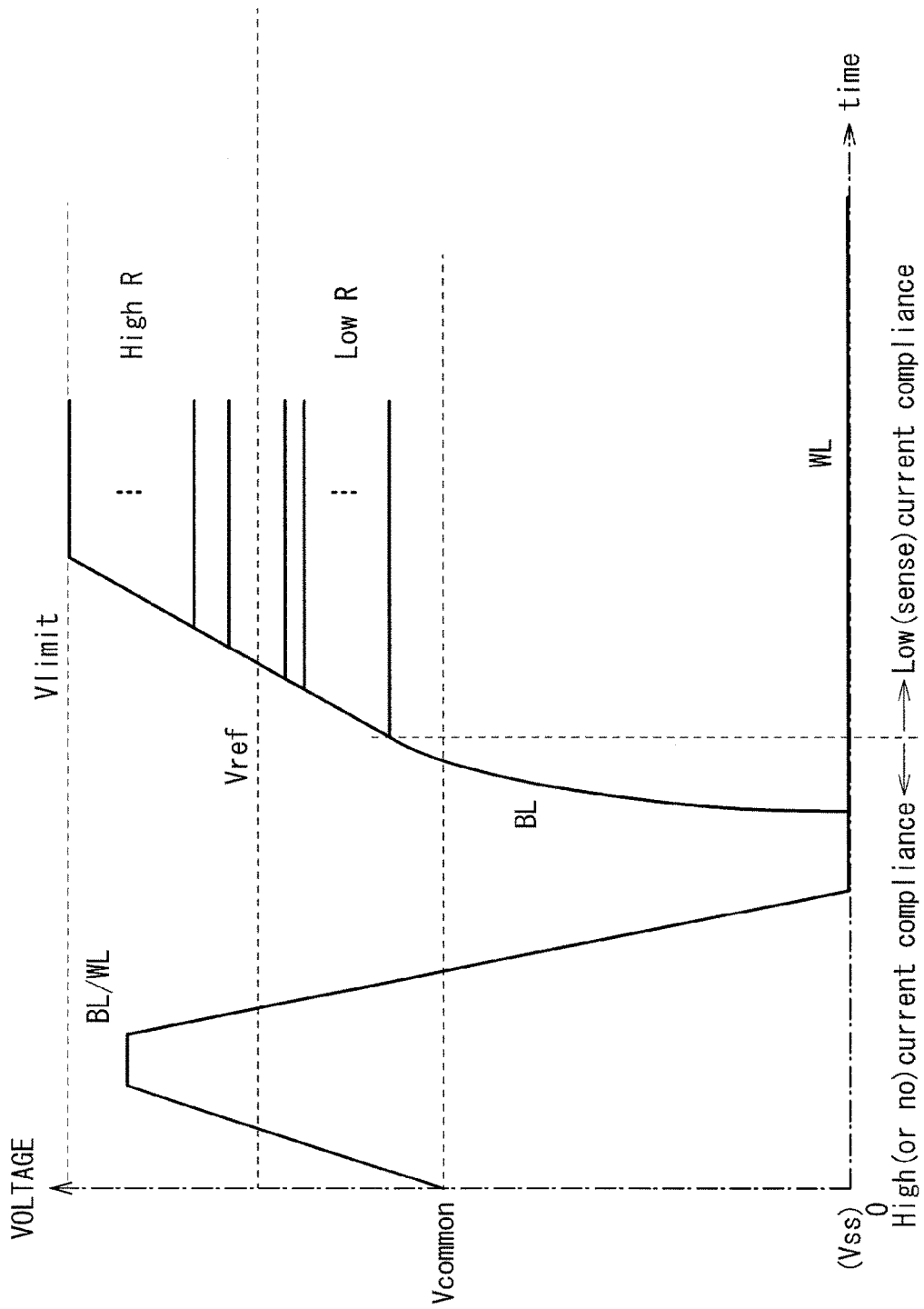
[FIG. 29]

[ FIG. 30 ]
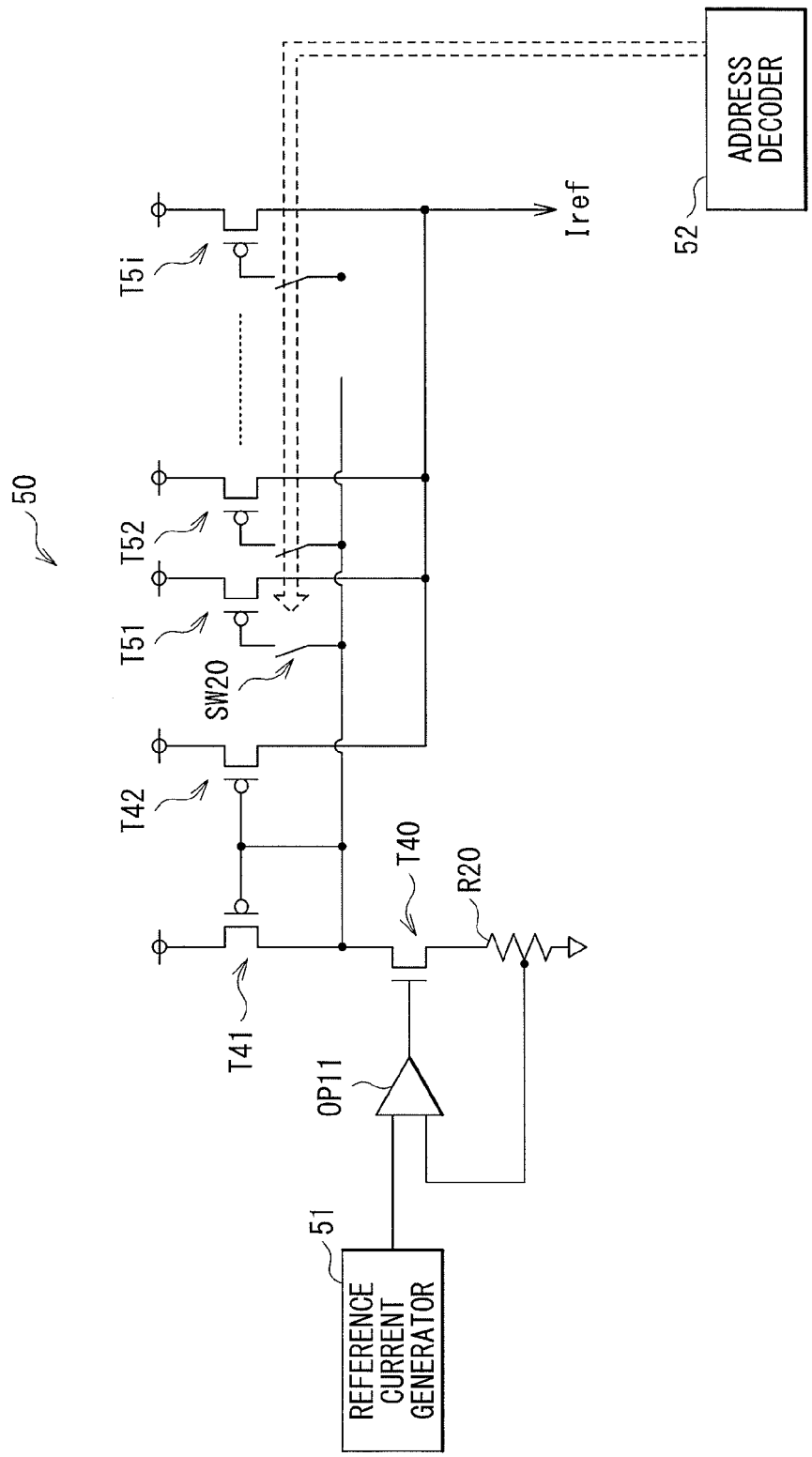

NON-VOLATILE MEMORY DEVICE WITH VARIABLE READOUT REFERENCE

TECHNICAL FIELD

The present disclosure relates to a non-volatile memory device in which memory cells including non-volatile storage elements are disposed in an array arrangement.

BACKGROUND ART

As non-volatile memories, a ReRAM (Resistive Random Access Memory), a CBRAM (Conduction Bridge Random Access Memory), a PCRAM (Phase-Change Random Access Memory), an MRAM (Magnetoresistive Random Access Memory), an STTRAM (Spin Transfer Torque Random Access Memory), and any other type of RAM are known. In the ReRAM, a resistive element that stores data in accordance with a change in a resistive state has been used as a non-volatile storage element (for example, see PTL 1).

Further, as a configuration of a memory cell using the above-described non-volatile memory, a 1R (1 Resistor) type and a 1D1R (1 Diode and 1 Resistor) type are known. A cross-point type memory device in which such memory cells are disposed at crossing sections of a plurality of bit lines and a plurality of word lines is known.

CITATION LIST

Patent Literature

[PTL 1] Japanese Unexamined Patent Application Publication No. 2009-211735

SUMMARY OF THE INVENTION

When data read operation is performed in the above-described non-volatile memory device, there is considered a method that detects a value of a readout current from a memory cell relative to a readout reference current in a state where a readout voltage is applied, or a value of a readout voltage from the memory cell relative to a readout reference voltage in a state where a readout current is applied. Meanwhile, in the cross-point type memory device, wiring resistances are present on the bit lines and word lines. Further, a leakage current that is caused by some unselected memory cells other than selected memory cells to be read may flow through selected bit lines. Those wiring resistances and leakage current may degrade readout accuracy.

PTL 1 proposes some method such as correcting a driver output voltage in advance on the basis of the wiring resistances; however, description is not provided on a concrete circuit configuration that corrects the driver output voltage. Further, readout compensation in consideration of a leakage current is not carried out.

Accordingly, it is desirable to provide a non-volatile memory device that makes it possible to improve the readout accuracy.

A non-volatile memory device according to one embodiment of the present disclosure includes: a plurality of bit lines; a plurality of bit lines; a plurality of word lines; a memory cell array having a plurality of memory cells each including a non-volatile storage element, one of the memory cells being disposed at each of a plurality of crossing sections of the plurality of bit lines and the plurality of word lines; a reference voltage generator circuit that generates a readout reference voltage serving as a reference for discrimination of data values stored on the memory cells; a readout circuit that reads the data values stored on the memory cells by detecting values of readout voltages from the memory cells relative to the readout reference voltage in a state where a predetermined current-limited readout current is applied to the bit lines; and an address compensation circuit that changes the readout reference voltage in accordance with a placement position of the memory cell to be read in the readout circuit.

In the non-volatile memory device according to the one embodiment of the present disclosure, the data values stored on the memory cells are read out by detecting the values of the readout voltages from the memory cells relative to the readout reference voltage in a state where the predetermined current-limited readout current is applied to the bit lines. At this time, the address compensation circuit changes the readout reference voltage in accordance with the placement position of the memory cell to be read.

A non-volatile memory device according to one other embodiment of the present disclosure includes: a plurality of bit lines; a plurality of word lines; a memory cell array having a plurality of memory cells each including a non-volatile storage element, one of the memory cells being disposed at each of a plurality of crossing sections of the plurality of bit lines and the plurality of word lines; a reference current generator circuit that generates a readout reference current serving as a reference for discrimination of data values stored on the memory cells; a readout circuit that reads the data values stored on the memory cells by detecting values of readout currents from the memory cells relative to the readout reference current in a state where a predetermined readout voltage is applied to the bit lines; and an address compensation circuit that changes the readout reference current in accordance with a placement position of a memory cell to be read of the memory cells in the readout circuit.

In the non-volatile memory device according to the other embodiment of the present disclosure, the data values stored on the memory cells are read out by detecting the values of the readout currents from the memory cells relative to the readout reference current in a state where a predetermined readout voltage is applied to the bit lines. At this time, the address compensation circuit changes the readout reference current in accordance with the placement position of the memory cell to be read of the memory cells.

According to the non-volatile memory device of the one embodiment of the present disclosure, the readout reference voltage is changed in accordance with the placement position of the memory cell to be read in detecting a value of a readout voltage from the memory cell relative to the readout reference voltage, which makes it possible to improve readout accuracy.

According to the non-volatile memory device of the other embodiment of the present disclosure, the readout reference current is changed in accordance with the placement position of the memory cell to be read in detecting a value of a readout current from the memory cell relative to the readout reference current, which makes it possible to improve readout accuracy.

It is to be noted that effects described here are non-limiting. Effects achieved by the technology may be one or more of effects described in the present disclosure.

BRIEF DESCRIPTION OF THE DRAWINGS

FIG. 1 is a circuit diagram illustrating a first example of a resistive memory element using a resistive element as a non-volatile memory element.

FIG. 2 is a circuit diagram illustrating a second example of the memory element using the resistive element as the non-volatile memory element.

FIG. 3 is an explanatory diagram illustrating an example of voltage-current characteristics in performing read operation utilizing a voltage application/current sensing method in the resistive memory element illustrated in FIG. 1.

FIG. 4 is an explanatory diagram illustrating an example of voltage-current characteristics in performing read operation utilizing the voltage application/current sensing method in the resistive memory element illustrated in FIG. 2.

FIG. 5 is an explanatory diagram illustrating an example of voltage-current characteristics in performing read operation utilizing a current application/voltage sensing method in the resistive memory element illustrated in FIG. 2.

FIG. 6 is an explanatory diagram illustrating an example of voltage-current characteristics when variations in a resistance occur in the resistive memory element illustrated in FIG. 2.

FIG. 7 is an explanatory diagram illustrating an example of a readout error in performing read operation utilizing the current application/voltage sensing method in the resistive memory element illustrated in FIG. 2.

FIG. 8 is an explanatory diagram illustrating an example of a method of correcting the readout error illustrated in FIG. 7.

FIG. 9 is a configuration diagram illustrating a configuration example of a non-volatile memory device according to a first embodiment of the present disclosure.

FIG. 10 is a circuit diagram illustrating a configuration example of a memory cell array.

FIG. 11 is a circuit diagram illustrating a configuration example of a voltage limiter-equipped current compliance circuit.

FIG. 12 is a circuit diagram illustrating a configuration example of a sensing amplifier circuit.

FIG. 13 is an explanatory diagram illustrating an example of an initial voltage waveform during read operation in the non-volatile memory device illustrated in FIG. 9.

FIG. 14 is an explanatory diagram illustrating an example of a voltage waveform during read operation following FIG. 13.

FIG. 15 is a timing chart illustrating an example of a readout result from the read operation illustrated in FIG. 14.

FIG. 16 is a configuration diagram illustrating a configuration example of a non-volatile memory device according to a second embodiment.

FIG. 17 is a circuit diagram illustrating a configuration example of an address compensation circuit.

FIG. 18 is a timing chart illustrating an example of read operation and a readout result in the non-volatile memory device illustrated in FIG. 16.

FIG. 19 is a configuration diagram illustrating a configuration example of a non-volatile memory device according to a third embodiment.

FIG. 20 is a circuit diagram illustrating a configuration example of a voltage detector circuit.

FIG. 21 is an explanatory diagram illustrating an example of voltage/current characteristics of a selective element.

FIG. 22 is an explanatory diagram illustrating an example of a leakage current flowing inside a memory cell array.

FIG. 23 is an explanatory diagram illustrating a voltage drop caused by a leakage current.

FIG. 24 is an explanatory diagram illustrating an example of a voltage waveform during read operation in the non-volatile memory device illustrated in FIG. 19.

FIG. 25 is a configuration diagram illustrating a configuration example of a non-volatile memory device according to a fourth embodiment.

FIG. 26 is an explanatory diagram illustrating an example of a voltage waveform during read operation in the non-volatile memory device illustrated in FIG. 25.

FIG. 27 is a configuration diagram illustrating a configuration example of a non-volatile memory device according to a fifth embodiment.

FIG. 28 is an explanatory diagram illustrating an example of a relationship between a bit line voltage and a compliance current.

FIG. 29 is an explanatory diagram illustrating an example of a voltage waveform during read operation in the non-volatile memory device illustrated in FIG. 27.

FIG. 30 is a circuit diagram illustrating a configuration example of a main part of a non-volatile memory device according to a sixth embodiment.

MODES FOR CARRYING OUT THE INVENTION

Hereinafter, some embodiments of the present disclosure are described in detail with reference to the drawings. It is to be noted that description is given in the following order.

0. Description of Resistive Memory Element
  0.1 Configuration (FIGS. 1 and 2)
  0.2 Issue in Voltage Application/Current Sensing Method (FIGS. 3 and 4)
  0.3 Issue in Current Application/Voltage Sensing Method (FIGS. 5 to 8)
1. First Embodiment (a non-volatile memory device of a current application/voltage sensing method including a voltage limiter) (FIGS. 9 to 15)
  1.1 Configuration
    1.1.1 Overall Configuration Example of Non-Volatile Memory Device (FIGS. 9 and 10)
    1.1.2 Configuration Examples of Voltage Limiter-Equipped Current Compliance Circuit (FIG. 11)
    1.1.3 Configuration Examples of Sensing Amplifier Circuit (FIG. 12)
  1.2 Operation
    1.2.1 Read Operation (FIGS. 13 to 15)
  1.3 Effects
2. Second Embodiment (a non-volatile memory device including an address compensation circuit) (FIGS. 16 to 18)
  2.1 Configuration
    2.1.1 Overall Configuration Example of Non-Volatile Memory Device (FIG. 16)
    2.1.2 Configuration Examples of Address Compensation Circuit (FIG. 17)
  2.2 Operation
    2.2.1 Read Operation (FIG. 18)
  2.3 Effects
3. Third Embodiment (a non-volatile memory device including a leakage compensation circuit) (FIGS. 19 to 24)
  3.1 Configuration
    3.1.1 Overall Configuration Example of Non-Volatile Memory Device (FIG. 19)
    3.1.2 Configuration Examples of Voltage Detector Circuit (FIG. 20)
  3.2 Operation
    3.2.1 Read Operation (FIGS. 21 to 24)
  3.3 Effects 4. Fourth Embodiment (a non-volatile memory device including a time-control current compliance function) (FIGS. 25 and 26)
    4.1 Configuration
        4.1.1 Overall Configuration Example of Non-Volatile Memory Device (FIG. 25)
    4.2 Operation
        4.2.1 Read Operation (FIG. 26)
    4.3 Effects
5. Fifth Embodiment (a non-volatile memory device including a bit-line-voltage-control current compliance function) (FIGS. 27 and 29)
    5.1 Configuration
        5.1.1 Overall Configuration Example of Non-Volatile Memory Device (FIG. 27)
    5.2 Operation
        5.2.1 Read Operation (FIGS. 28 to 29)
    5.3 Effects
6. Sixth Embodiment (a non-volatile memory device of a voltage application/current sensing method) (FIG. 30)
    6.1 Configuration and Operation
    6.2 Effects
7. Other Embodiments

0. Description of Resistive Memory Element

[0.1 Configuration]

FIG. 1 illustrates a first example of a resistive memory element using a resistive element VR as a non-volatile memory element. FIG. 2 illustrates a second example of the resistive memory element.

The resistive memory element illustrated in FIG. 1 is configured to have a memory cell MC of a 1T1R (1 Transistor and 1 Resistor) type that includes the resistive element VR and a three-terminal MOS (Metal-Oxide Semiconductor) transistor TE. A gate terminal of the MOS transistor TE is coupled to a word line WL; a drain terminal thereof is coupled to a bit line BL; and a source terminal thereof is coupled to a source line SL through the resistive element VR. Wiring resistances $R_{BL}$ and $R_{SL}$ are present on the bit line BL and the source line SL, respectively. Further, parasitic capacitances $C_{BL}$ and $C_{SL}$ are also present on the bit line BL and the source line SL, respectively.

When a memory cell array is configured with use of the 1T1R-type resistive memory element, three wiring lines of the bit line BL, the word line WL, and the source line SL are necessary. This makes it difficult to achieve high-density placement of the memory cell MC that is a beneficial feature of a cross-point type memory device. The 1T1R type allows a current value of the memory cell MC to be controlled using the word line WL. This makes it possible to suppress variations in voltage on the bit line BL and the word line WL upon a change in resistance of the resistive element VR.

The resistive memory element illustrated in FIG. 2 is configured to have a memory cell MC of a 1S1R (1 Selector and 1 Resistor) type in which the resistive element VR and a selective element SE are coupled in series. It is to be noted that FIG. 2 illustrates a configuration of a memory cell MC of a 1D1R (1 Diode and 1 Resistor) type that uses a diode for the selective element SE as the 1S1R-type memory cell MC.

The cross-point type memory device is configured by disposing such memory cells MC of the 1D1R type at crossing sections of the plurality of bit lines BL and the plurality of word lines WL. In such a cross-point type memory device, the bit line BL is coupled to one end of the resistive element VR, and the word line WL is coupled to one end of the selective element SE. Wiring resistances $R_{BL}$ and $R_{WL}$ are present on the bit line BL and the word line WL, respectively. Further, parasitic capacitances $C_{BL}$ and $C_{WL}$ are also present on the bit line BL and the word line WL, respectively.

As a method of reading a data value stored on the memory cell MC in the non-volatile memory device, a voltage application/current sensing method and a current application/voltage sensing method are available. In the voltage application/current sensing method, the data value is read by detecting a value of a readout current from the memory cell MC relative to a readout reference current Iref in a state where a readout voltage is applied to the bit line BL. In the current application/voltage sensing method, the data value is read by detecting a value of a readout voltage from the memory cell MC relative to a readout reference voltage Vref in a state where a readout current is applied to the bit line BL.

Hereinafter, description is provided on issues in with the above respective sensing methods.

[0.2 Issues in Voltage Application/Current Sensing Method]

FIG. 3 illustrates an example of voltage-current characteristics in performing read operation utilizing the voltage application/current sensing method in the 1T1R-type resistive memory element illustrated in FIG. 1. It is to be noted that FIG. 3 illustrates the respective voltage-current characteristics of the resistive element VR and the MOS transistor TE. The characteristics of the MOS transistor TE exhibit characteristics of a linear region. FIG. 4 illustrates an example of voltage-current characteristics in performing read operation utilizing the voltage application/current sensing method in the 1D1R-type resistive memory element illustrated in FIG. 2. It is to be noted that FIG. 4 illustrates the respective voltage-current characteristics of the resistive element VR and the selective element SE. The characteristics of the selective element SE indicate those of a diode.

In the resistive memory element, a resistive state of the resistive element VR changes into a high-resistance state and a low-resistance state. For example, a data value to be stored may be discriminated as "0" in the high-resistance state, and as "1" in the low-resistance state. As illustrated in FIGS. 3 and 4, comparison between the readout reference current Iref and a value of the readout current from the resistive element VR makes it possible to discriminate the resistive state of the resistive element VR, and by extension to the data value.

As illustrated in FIG. 3, in the voltage application/current sensing method, the 1T1R type makes it possible to achieve detection at low current with the help of transistor characteristics thereof. In contrast, in the 1D1R type, a large current may flow while the resistive element VR is in the low-resistance state, as illustrated in FIG. 4. In the cross-point type memory device, to achieve a high-density memory cell array, a two-terminal selective element SE may be often used as the selective element SE instead of the three-terminal MOS transistor TE, as found in the 1D1R type. Thus, the selective element SE has no current-limiting capability during read operation. In the 1D1R type, the resistive element VR that is subjected to read operation has a large breadth of resistance, and therefore a large current may flow depending on the resistance, as illustrated in FIG. 4, which may possibly cause element destruction or deterioration in the characteristics.

[0.3 Issue in Current Application/Voltage Sensing Method]
[Increase in Readout Voltage]

FIG. 5 illustrates an example of the voltage-current characteristics of the resistive element VR in performing read operation utilizing the current application/voltage sensing method in the 1D1R-type resistive memory element illustrated in FIG. 2.

As illustrated in FIG. 5, in the current application/voltage sensing method a data value stored on the memory cell MC is read by detecting a value of a readout voltage from the memory cell MC relative to the readout reference voltage Vref in a state where a predetermined readout current of a current-limited constant current (readout compliance current Icomp) is applied to the bit line BL. In this case, the value of the readout voltage becomes a product (IR product) of a current flowing through the resistive element VR and a resistance thereof.

FIG. 6 illustrates an example of the voltage-current characteristics of the resistive element VR when variations in resistance occur in the 1D1R-type resistive memory element illustrated in FIG. 2. When the read operation is performed with use of the current application/voltage sensing method in the 1D1R-type resistive memory element, the resistive element VR that is subjected to read operation may have a wide range of resistance over several orders of magnitude, which may possibly cause a high voltage to be applied when the resistive element VR is in the high-resistance state. For example, as illustrated in FIG. 6, when variations in an extremely high-resistance state occur in the resistive element VR, a high voltage may be applied. In such a case, as found in a first embodiment to be hereinafter described, it may be preferable to apply voltage limitation to the readout voltage from the memory cell MC.

[Readout Error]

FIG. 7 illustrates an example of a readout error in performing read operation utilizing the current application/voltage sensing method in the 1D1R-type resistive memory element illustrated in FIG. 2. As illustrated in FIG. 7, in the current application/voltage sensing method, a readout voltage in the low-resistance state may increase above the readout reference voltage Vref, which may possibly cause a readout error due to, for example, the wiring resistance $R_{BL}$ of the bit line BL and the wiring resistance $R_{WL}$ of the word line WL, and a leakage current ILeak of a semi-selected cell MCb.

FIG. 8 illustrates an example of a method of correcting the readout error illustrated in FIG. 7. As with second and third embodiments to be hereinafter described, it is possible to prevent the readout error based on the readout reference voltage Vref by performing compensation for the wiring resistances $R_{BL}$ and $R_{WL}$ based on read addresses, compensation for the leakage current ILeak based on voltage detection, or any other compensation.

Hereinafter, more detailed description is provided on the readout error.

When the readout reference voltage Vref is fixed at a certain same voltage in the current application/voltage sensing method, a voltage drop represented by the IR product may take place due to addresses of the bit line BL to be selected and the word line WL to be selected, and a bit line voltage different depending on the address may be read even if the resistive elements VR having the same resistance are read, which may pose a possibility of different read results.

Here, the resistive element VR has a unipolar type that achieves write and erasure by applying voltages of the same polarity in write operation, and a bipolar type that achieves write and erasure by applying voltages of the reverse polarity.

In the unipolar type, a voltage of half the value of a voltage to be applied to a selected memory cell MC (selected cell MCb) is applied to a memory cell MC (semi-selected cell MCb) that is disposed between a selected bit line BL and an unselected word line WL. At this time, there exist cells in the high-resistance state and cells in the low-resistance state at an indeterminate rate in the semi-selected cell MCb. The leakage current ILeak in a semi-selected state may be significantly different between the cell in the high-resistance state and the cell in the low-resistance state, which may cause also the leakage current ILeak of the whole bit line BL to be indeterminate. As a result, even if the same read addresses are read, the data that has been previously written to the semi-selected cell MCb may cause the IR product to be made different, and therefore a different bit line voltage may be read, which may pose a possibility of different read results.

In the case of the bipolar type, the leakage current ILeak may also flow through the semi-selected cell MCb that is disposed between the selected bit line BL and the unselected word line WL, in addition to the case of the above-described unipolar type. The wiring resistance $R_{BL}$ of the bit line BL and the wiring resistance $R_{WL}$ of the word line WL, and the leakage current ILeak flowing via the semi-selected cell MCb mentioned above each have respectively temperature characteristics, and therefore the IR product may differ due to a difference of the temperature. As a result, a different bit line voltage may be read, which may pose a possibility of different read results.

Due to combination of the wiring resistances $R_{BL}$ and $R_{WL}$, the leakage current ILeak, and temperature mentioned above, the IR product in the address to be read may differ, which may pose a possibility that a bit line voltage to be outputted will vary. As a result, when the same readout reference voltage Vref is used, it may be possibly difficult to deal with the bit line voltage that varies on a case-by-case basis.

It is to be noted that a similar readout error may possibly occur also in the voltage application/current sensing method. A current flowing through the bit line BL may differ depending on a read address, and use of the fixed readout reference current Iref may possibly make a difference in a threshold that determines a resistive state by on a read address, which may cause a readout error in such a case.

[Other Issues]

In the cross-point type memory device using the two-terminal selective element SE, when the memory cell MC prior to read operation is in an unselected state, an element that is coupled to the bit line BL, and serves to limit a current to a fixed level and to apply such a current is operating at an unsaturated region. However, when the selective element SE is selected, a current flows through the memory cell MC, and the element for current limitation transitions to a saturated region, resulting in a state between a source and a drain being turned to a high-impedance state. Consequently, charges stored in the parasitic capacitance $C_{BL}$ of the bit line BL are discharged to the word line WL through the memory cell MC. At this time, transition from the unselected state to the selected state of the selective element SE is typically performed rapidly, and therefore a transient current may flow, which may raise a possibility that the bit line BL will be transiently turned to a high-voltage state.

In the cross-point type memory device, prior to read operation and write operation, a common voltage Vcommon equivalent to a half of a maximum write voltage is typically applied to both of the bit line BL and the word line WL to mainly minimize the leakage current ILeak. At the beginning of the read operation from such a state, when charging of the bit line BL is started from the common voltage Vcommon, indeterminate charges that have accumulated beforehand on the parasitic capacitance $C_{BL}$ of the bit line BL may raise a possibility of an unintended increase in a bit voltage as described above in an early stage of the read operation. This results in an excessive current flowing through the resistive element VR, which may possibly cause the characteristics to be degraded.

Accordingly, as illustrated in FIGS. 13 to 15 in the first embodiment to be hereinafter described, it may be preferable to charge a selected bit line until reaching a readout voltage after the selected bit line and the selected word line used for selection of the memory cell MC to be read are set to a ground potential Vss to be once discharged.

Further, when charging is performed using a small current to be used for voltage sensing until the bit line BL reaches a predetermined voltage that allows for sensing relative to the readout reference voltage Vref, the charging may often take much time in accordance with the parasitic capacitance $C_{BL}$ inherent in the bit line BL, which may raise a possibility of longer read time. On the contrary, when a current is simply increased, an excessive amount of current unnecessarily flows through the resistive element VR, which may possibly cause the characteristics of the element to be degraded.

Therefore, as mentioned in fourth and fifth embodiments to be hereinafter described, it may be preferable to change a current-limit value of a readout current during charging of the selected bit line.

1. First Embodiment

In the present embodiment, description is provided by taking, as an example, a non-volatile memory device using the above-described 1D1R-type resistive memory element. Further, a read method is described by taking, as an example, a case of using the above-described current application/voltage sensing method.

[1.1 Configuration]
[1.1.1 Overall Configuration Example of Non-Volatile Memory Device]

FIG. 9 illustrates an example of an overall configuration of a non-volatile memory device 1 according to the first embodiment of the present disclosure. The non-volatile memory device 1 may include a control circuit 10, a memory cell array 11, a bit-line decoder 12, a word-line decoder 13, a voltage limiter-equipped current compliance circuit 14, a read/write circuit 15, and a reference voltage generator circuit 16.

The memory cell array 11 may be a cross-point type memory cell array where memory cells MC are disposed vertically at a plurality of crossing sections of a plurality of bit lines BL and a plurality of word lines WL. The memory cells MC each may include a nonvolatile resistive element VR and a two-terminal selective element SE that are coupled in series. FIG. 10 illustrates an equivalent circuit diagram of the memory cell array. FIG. 10 illustrates an example where the memory cells MC are disposed at crossing sections of three bit lines BL0, BL1, and BL2 and three word lines WL0, WL1, and WL2; however, the number of the bit lines BL, the number of the word lines WL, and the number of the memory cells MC are not limited to those in the illustrated example.

In the memory cell array 11, it may be possible to write data to the memory cell MC that is designated by an address input from outside. Further, it may be possible to read data stored on the memory cell MC that is designated by the address input. A data value to be stored on the memory cell MC may be discriminated by a resistive state of the resistive element VR. For example, the data value may be discriminated as "0" in the high-resistance state, and as "1" in the low-resistance state.

A control signal and a signal indicating an address from outside may be inputted to the control circuit 10. Further, read data and write data may be inputted to and outputted from the control circuit 10 and the read/write circuit 15. The read/write circuit 15 may perform write operation of data to be stored on the memory cell array 11, and read operation of data stored on the memory cell array 11. The read/write circuit 15 may carry out data read operation using, for example, the above-described current application/voltage sensing method.

The bit-line decoder 12 may be coupled to each of the bit lines BL of the memory cell array 11 to select the corresponding bit line BL (selected bit line) by a column address that is inputted from an address line. Further, all of the bit lines BL that are not selected at this time are called unselected bit lines.

The word-line decoder 13 may be coupled to each of the word lines WL of the memory cell array 11 to select the corresponding word line WL (selected word line) by a row address that is inputted from the address line. Further, all of the word lines WL that are not selected at this time are called unselected word lines.

The reference voltage generator circuit 16 may generate a certain fixed readout reference voltage Vref. When a voltage that is generated after a readout current load is applied to the selected bit line is higher than the readout reference voltage Vref, it may indicate the high-resistance state (0), and when such a voltage is lower, it may indicate the low-resistance state (1).

[1.1.2 Configuration Examples of Voltage Limiter-Equipped Current Compliance Circuit]

The voltage limiter-equipped current compliance circuit 14 may limit a current flowing through the bit lines BL to a setting value, and also a voltage up to a fixed upper limit. A circuit example of the voltage limiter-equipped current compliance circuit 14 is illustrated in FIG. 11.

The voltage limiter-equipped current compliance circuit 14 may include a current compliance circuit 31 and a current limiter circuit 32, as illustrated in FIG. 11. The current compliance circuit 31 may have PMOS transistors T11 and T12 whose gate terminals are coupled to each other, and a constant current source 33. The current limiter circuit 32 may have an NMOS transistor T13. The current limiter circuit 32 may be coupled to the bit line BL.

The transistors T11 and T12, and the constant current source 33 may configure a current mirror circuit. When the transistor T11 operates in a saturated region, a constant current of the constant current source 33 may be supplied to the bit lines BL as a compliance current Icomp for read operation. A voltage equivalent to a sum of a predetermined limiting voltage Vlimit and a predetermined threshold voltage Vth may be supplied to a gate terminal of the transistor T13. When a readout voltage Vout reaches the predetermined limiting voltage Vlimit, the transistor 13 may operate in the saturated region, and the readout voltage Vout may not increase above the limiting voltage Vlimit.

[1.1.3 Configuration Examples of Sensing Amplifier Circuit]

The read/write circuit 15 may have a drive circuit that applies a predetermined voltage as a power source for the voltage limiter-equipped current compliance circuit 14 coupled to the selected bit line. The read/write circuit 15 may also include a sensing amplifier circuit 40 that compares a selected bit line voltage and the readout reference voltage Vref after read operation to output a data value of either 0 or 1 in accordance with the resistance. FIG. 12 illustrates an example of the sensing amplifier circuit 40.

The sensing amplifier circuit 40 may include PMOS transistors T21 and T22 whose gate terminals are coupled to each other, NMOS transistors T23 and T24, and an NMOS transistor T25, as illustrated in FIG. 12. The transistors T21 and T22 may be coupled to a power source and the transistors T23 and T24. The transistors T23 and T24 may be coupled to the transistors T21 and T22, and the transistor T25. A voltage from the bit lines BL may be inputted to a gate terminal of the transistor T23. The readout reference voltage Vref may be inputted to a gate terminal of the transistor T24.

The sensing amplifier circuit 40 may be configured as a differential sensing amplifier. The transistors T21 and T22 may configure a current mirror circuit. The transistors T23 and T24 may be a differential pair. The transistor T25 may be a switch that turns the sensing amplifier circuit 40 to an operating state, and an operation enable signal Vb may be inputted to a gate terminal thereof.

The sensing amplifier circuit 40 may compare voltages that are inputted to gate terminals of the transistors T23 and T24, and may output a sensing result "low" as a detection value Sout when a gate voltage of the transistor T23 is higher than a gate voltage of the transistor T24. When the gate voltage of the transistor T23 is lower than the gate voltage of the transistor T24, the sensing amplifier circuit 40 may output a sensing result "high" as the detection value Sout.

[1.2 Operation]
[1.2.1 Read Operation]

FIG. 13 illustrates an example of an initial voltage waveform during read operation in the non-volatile memory device 1 illustrated in FIG. 9. FIG. 14 illustrates an example of a voltage waveform during read operation following FIG. 13. FIG. 15 illustrates an example of a readout result from the read operation illustrated in FIG. 14. In each of FIGS. 13 to 15, a horizontal axis denotes time, and a vertical axis denotes a voltage value or a signal value.

First, prior to read operation, the read/write circuit 15 may drive all of the bit lines BL and the word lines WL to the common voltage Vcommon through the bit-line decoder 12 and the word-line decoder 13 (FIG. 13). Next, the read/write circuit 15 may once drive the selected bit line and the selected word line used for selection of the memory cell MC to be subjected to read operation to a ground potential Vss to discharge the selected bit line and the selected word line through the bit-line decoder 12 and the word-line decoder 13 (FIG. 13).

Thereafter, the read/write circuit 15 may charge the selected bit line until reaching the readout voltage Vout (FIG. 14). The readout voltage Vout may be limited to a predetermined upper limit by the voltage limiter-equipped current compliance circuit 14. Once a voltage of the selected bit line reaches the readout voltage Vout of the selected memory cell MC, the read/write circuit 15 may determine whether a data value stored on the memory cell MC is 0 or 1 by whether the readout voltage is higher or lower than the readout reference voltage Vref that is generated by the reference voltage generator circuit 16 (FIG. 15). A lower portion of FIG. 15 illustrates an example of a timing chart of an operation enable signal (SA enable) to be inputted to the sensing amplifier circuit 40 of the read/write circuit 15, and the detection value Sout to be outputted as a readout result.

[1.3 Effects]

According to the present embodiment, the upper limit of the readout voltage Vout is limited by the voltage limiter-equipped current compliance circuit 14, which makes it possible to suppress application of an excessively high voltage to the resistive element VR during read operation. Further, after the selected bit line and the selected word line are once driven to the ground voltage Vss to be discharged, the selected bit line is charged until reaching the readout voltage Vout, which makes it possible to suppress an unintended increase in voltage in an early stage of the read operation.

It is to be noted that the effects described herein are merely exemplified and non-limiting, and effects of the present disclosure may be other effects, or may further include other effects. This applies to other subsequent embodiments and modification examples.

2. Second Embodiment

Next, description is provided on a second embodiment of the present disclosure. Hereinafter, description on component parts having a configuration and workings similar to those in the above-described first embodiment is omitted as appropriate.

[2.1 Configuration]
[2.1.1 Overall Configuration Example of Non-Volatile Memory Device]

FIG. 16 illustrates an example of an overall configuration of a non-volatile memory device 1-1 according to the second embodiment of the present disclosure. The non-volatile memory device 1-1 may further include an address compensation circuit 17 that is added to a configuration of the non-volatile memory device 1 illustrated in FIG. 9. A signal indicating an address may be inputted to the address compensation circuit 17. Any other configuration may be substantially similar to the configuration of the non-volatile memory device 1 in FIG. 9. In the present embodiment as well, description is provided by taking, as an example, a non-volatile memory device using the above-described 1D1R-type resistive memory element. Further, a read method is described by taking, as an example, a case of using the above-described current application/voltage sensing method.

In the current application/voltage sensing method, at the time of reading the readout voltage Vout represented by a IR product of a selected cell MCa by applying a readout current, the wiring resistance $R_{BL}$ of the selected bit line and the wiring resistance $R_{WL}$ of the selected word line may not be negligible. The wiring resistances $R_{BL}$ and $R_{WL}$ per single cell may be almost uniform, and therefore the IR product obtained by the wiring resistances $R_{BL}$ and $R_{WL}$ as far as the selected cell MCa may be linearly proportional to an address. The IR product may cause a voltage applied to the selected cell MCa to be dropped, leading to drop of the readout voltage Vout as well. Therefore, when the dropped readout voltage Vout is sensed using the fixed readout reference voltage Vref, it is likely that the memory cell MC to be essentially determined as the high-resistance state will be erroneously determined as the low-resistance state, as illustrated in the above-described FIG. 7.

Accordingly, in the present embodiment, the address compensation circuit 17 may perform control to change the readout reference voltage Vref in accordance with a placement position (address) of the memory cell MC to be read.

[2.1.2 Configuration Examples of Address Compensation Circuit]

FIG. 17 illustrates a configuration example of the address compensation circuit 17. The address compensation circuit 17 may include a reference voltage generator 41, an operational amplifier OP1, a PMOS transistor T30, and a ladder resistor circuit 43, as illustrated in FIG. 17. The ladder resistor circuit 43 may have a plurality of dummy resistors R10 and a plurality of switches SW10.

The address compensation circuit 17 allows the readout reference voltage Vref to be varied in accordance with selected column addresses (addresses of the bit lines BL) and selected row addresses (addresses of the word lines WL). The reference voltage generator 41 may generate a reference voltage that is generated by a bandgap voltage reference, for example. The operational amplifier OP1 and the transistor T30 may generate the readout reference voltage Vref that is divided from a reference voltage generated by the reference voltage generator 41. It is possible to obtain a division ratio from the reference voltage in such a manner that the number of bits obtained from the sum of addresses of the bit lines BL and addresses of the word lines WL is decoded by an address decoder 42, and a switch SW of the ladder resistor circuit 43 is switched. The dummy resistors R10 of the ladder resistor circuit 43 may be provided by the number equal to the actual sum of the addresses of the bit lines BL and the addresses of the word lines WL. For example, when the memory cell array 11 employs a configuration of (1024 bit lines BL)×(1024 word lines WL), 2048 dummy resistors R10 may be coupled in series to be used as dummies for the memory cell array 11.

[2.2 Operation]
[2.2.1 Read Operation]

FIG. 18 illustrates an example of read operation and a readout result in the non-volatile memory device 1-1 illustrated in FIG. 16. In FIG. 18, a horizontal axis denotes time, and a vertical axis denotes a voltage value or a signal value. A lower portion of FIG. 18 illustrates an example of a timing chart of the operation enable signal (SA enable) to be inputted to the sensing amplifier circuit 40 of the read/write circuit 15, and the detection value Sout to be outputted as a readout result.

The read operation in the present embodiment may be substantially similar to the read operation in the above-described first embodiment; however, the address compensation circuit 17 varies the readout reference voltage Vref in accordance with the selected address, as illustrated in FIG. 18. This ensures to compensate for variations in the readout voltage Vout. This makes it possible to correct a readout error as illustrated in above-described FIG. 7 in a manner as illustrated in FIG. 8.

[2.3 Effects]

According to the present embodiment, the readout reference voltage Vref is changed in accordance with a placement position of the memory cell MC to be read, which allows for improvement of read accuracy. According to the present embodiment, it is possible to compensate for variations in the readout voltage Vout for the read address by the wiring resistances $R_{BL}$ and $R_{WL}$, thereby allowing for suppression of the readout error.

3. Third Embodiment

Next, description is provided on a third embodiment of the present disclosure. Hereinafter, description on any component parts having a configuration and workings similar to those in the above-described first embodiment or the above-described second embodiment is omitted as appropriate.

[3.1 Configuration]
[3.1.1 Overall Configuration Example of Non-Volatile Memory Device]

FIG. 19 illustrates an example of an overall configuration of a non-volatile memory device 1-2 according to the third embodiment of the present disclosure. The non-volatile memory device 1-2 may further include a bit-line voltage detector circuit 18 and a word-line voltage detector circuit 19 in a configuration of the non-volatile memory device 1-1 illustrated in FIG. 16. Further, the non-volatile memory device 1-2 may include an address leakage compensation circuit 17A instead of the address compensation circuit 17. Any other configuration may be substantially similar to the configuration of the non-volatile memory device 1-1 in FIG. 16. In the present embodiment as well, description is provided by taking, as an example, a non-volatile memory device using the above-described 1D1R-type resistive memory element. Further, a read method is described by taking, as an example, a case of using the above-described current application/voltage sensing method.

The address leakage compensation circuit 17A may be a circuit that performs leakage compensation in addition to address compensation in the above-described second embodiment. In the cross-point type memory device, the selective element SE may have to posses characteristics as illustrated in FIG. 21 (in the case of the bipolar-type resistive element VR). Here, in a case where the common voltage Vcommon is equivalent to a half of a voltage Vsel for driving a selected bit-line voltage, a voltage to be applied to a semi-selected cell MCb that is disposed between the selected bit line and the unselected word line when a voltage up to the voltage Vsel is applied to the selected bit line may become the common voltage Vcommon, and a current flowing at that time may become Ihalf.

The current flowing out of the selected bit line and the leakage current ILeak flowing into the selected word line may become a total amount of the current of the semi-selected cell. However, this current may be different significantly depending on the ratio of whether the resistive element VR inside each semi-selected cell MCb is in the high-resistance state or the low-resistance state. As a result, in current application/read operation on the selected cell MCa, the IR product may increase nonlinearly with an increase in the address due to the leakage current ILeak of the overall semi-selected cell MCb, and the leakage current ILeak caused by the semi-selected cell MCb in a path as far as the selected cell MCa, in addition to the IR product obtained by the wiring resistances $R_{BL}$ and $R_{WL}$.

To deal with this, prior to operation of selecting a cell to be read, the overall leakage current ILeak of the selected bit line and the selected word line that is caused by the semi-selected cell MCb may be detected to correct the readout reference voltage Vref using the detected current value. This does not make it possible to obtain the IR product for each address; however it is possible to further improve accuracy of the address compensation circuit 17 in the above-described second embodiment by correcting the overall readout reference voltage Vref on average.

FIG. 22 illustrates an example of the leakage current ILeak flowing through the semi-selected cell MCb inside the memory cell array 11. For example, in the example in FIG. 22, the selected cell MCa may be a crossover point of a bit line BL1 and a word line WL1. V/2 may be applied to unselected lines (BL0, BL2, WL0, and WL2); V may be applied to the selected bit line BL1; and 0 V may be applied to the selected word line WL1. Further, V may be applied to the selected cell MCa, while V/2 or −V/2 may be applied to the semi-selected cell MCb, and a corresponding current may flow.

[3.1.2 Configuration Examples of Voltage Detector Circuit]

The bit-line voltage detector circuit 18 may detect a bit-line voltage at a far end (far-end voltage) for the read/write circuit 15 in each of the plurality of bit lines BL. The word-line voltage detector circuit 19 may detect a word-line voltage at a far end (far-end voltage) for the read/write circuit 15 in each of the plurality of word lines WL.

FIG. 20 illustrates a source follower circuit as an example of a voltage detector circuit that is applicable to the bit-line voltage detector circuit 18 and the word-line voltage detector circuit 19. The voltage detector circuit may output a different voltage for the far-end voltage of the bit line BL or the word line WL to correct the readout reference voltage Vref.

Each of the bit-line voltage detector circuit 18 and the word-line voltage detector circuit 19 may include a PMOS transistor T31, an NMOS transistor T32, and a current source 34, as illustrated in FIG. 20. A signal Enable for turning on/off operation of this voltage detector circuit may be inputted to a gate terminal of the transistor T31. It is to be noted that the transistor T31 may be omitted, and constant detection operation may be performed. The far-end voltage of the bit line BL or the word line WL may be inputted to a gate terminal of the transistor T32. The transistor T32 and the current source 34 may configure the source follower circuit. An input is turned to a high-impedance state, which may have no influence on the voltage and the current in the bit line BL and the word line WL.

[3.2 Operation]
[3.2.1 Read Operation]

In the present embodiment, a voltage drop that is caused by the leakage current ILeak flowing through the bit lines BL and the word lines WL may be detected by the bit-line voltage detector circuit 18 and the word-line voltage detector circuit 19. The address leakage compensation circuit 17A may correct the readout reference voltage Vref on the basis of the detected result.

In the non-volatile memory device 1-2, prior to the read operation, all of the bit lines BL and the word lines WL may be driven to the common voltage Vcommon. At the start of the read operation, a voltage higher than the common voltage Vcommon may be applied to the selected bit line and the selected word line at the same time. At this time, it may be possible for the bit-line voltage detector circuit 18 and the word-line voltage detector circuit 19 that are disposed at far ends of the selected bit line and the selected word line to detect a dropped voltage in each of the lines. The voltage drop that is caused by the wiring resistances $R_{BL}$ and $R_{WL}$ may be constant, and thus it is possible to detect each leakage current ILeak by subtracting such an amount. FIG. 23 illustrates the operation at this time. Further, FIG. 24 illustrates an example of the read operation in the non-volatile memory device 1-2. In each of FIGS. 23 and 24, a horizontal axis denotes time, and a vertical axis denotes a voltage value.

The far-end voltage as illustrated in FIG. 23 may be inputted to a detector circuit illustrated in FIG. 20 to compensate for the leakage current. By giving a feedback of such a detected leakage current value to the address leakage compensation circuit 17A, the address-compensated readout reference voltage Vref may be further corrected. The subsequent read operation may be substantially similar to the read operation in the above-described first embodiment or the above-described second embodiment. It is to be noted that the readout voltage Vout in the high-resistance state may be limited to a predetermined limiting voltage Vlimit by the voltage limiter-equipped current compliance circuit 14, as illustrated in FIG. 24.

[3.3 Effects]

According to the present embodiment, the leakage compensation is performed in addition to the address compensation, which makes it possible to prevent a readout error with higher accuracy.

4. Fourth Embodiment

Next, description is provided on a fourth embodiment of the present disclosure. Hereinafter, description on any component parts having the configuration and workings similar to those of the above-described first to third embodiments is omitted as appropriate.

[4.1 Configuration]
[4.1.1 Overall Configuration Example of Non-Volatile Memory Device]

FIG. 25 illustrates an example of an overall configuration of a non-volatile memory device 1-3 according to the fourth embodiment of the present disclosure. The non-volatile memory device 1-3 may further include a timing control circuit 20 in a configuration of the non-volatile memory device 1-2 illustrated in FIG. 19. Any other configuration may be substantially similar to the configuration of the non-volatile memory device 1-2 in FIG. 19. In the present embodiment as well, the description is provided by taking as an example a non-volatile memory device using the above-described 1D1R-type resistive memory element. Further, a read method is described by taking as an example a case of using the above-described current application/voltage sensing method.

The timing control circuit 20 may be a current control circuit that changes a current-limiting value of a readout current during charging of the selected bit line.

[4.2 Operation]
[4.2.1 Read Operation]

In the above-described third embodiment, a readout current to be supplied to the bit line BL is limited to a small level, which may often delay an increase in a voltage of the bit line BL, as illustrated in FIG. 24. The read operation in the present embodiment may be substantially similar to the read operation in the above-described third embodiment, but may be different in that a current load may change immediately before the selective element SE is turned to a selected state. The read operation in the present embodiment is illustrated in FIG. 26. In FIG. 26, a horizontal axis denotes time, and a vertical axis denotes a voltage value. As illustrated in FIG. 26, control may be performed to relax the current limitation of the readout current until a voltage of the bit line BL rises to some extent.

When the IR product of the selected cell MCa is obtained by applying a constant readout current, the current may be a current in the same direction as write or erasure operation. Therefore, during the read operation, a very small amount of current may be applied to minimize an influence of characteristics deterioration that is caused by the current. Meanwhile, in a case where a voltage of the selected bit line that is grounded to the ground potential Vss in an early stage of the read operation is raised until the selective element SE is selected and the readout voltage Vout is outputted, when charging is performed with the very small amount of current load as described above, such charging may take much time in accordance with the parasitic capacitance $C_{BL}$ of the bit line BL.

To deal with this, a limiting value of the readout current may be increased, or the readout current may not be limited until a voltage of the selected bit line is raised up to a level that allows the selective element SE to supply a current. Thereafter, before the selective element SE is selected, and a current flows through the resistive element VR, the readout current may be limited to a predetermined current value. At this time, a limiting current value may be changed after a lapse of the time determined by the timing control circuit 20. Such a method allows charging of the selected bit line to be accelerated, which makes it possible to reduce read time.

[4.3 Effects]

According to the present embodiment, time-based control of the current limiting value makes it possible to accelerate the read time that is slowed down by limiting the readout current, thereby shortening the read time.

5. Fifth Embodiment

Next, description is provided on a fifth embodiment of the present disclosure. Hereinafter, description on any component parts having the configuration and workings similar to those of the above-described first to fourth embodiments is omitted as appropriate.

[5.1 Configuration]

[5.1.1 Overall Configuration Example of Non-Volatile Memory Device]

FIG. 27 illustrates an example of an overall configuration of a non-volatile memory device 1-4 according to the fifth embodiment of the present disclosure. The non-volatile memory device 1-4 may further include a compliance current control circuit 21 instead of the timing control circuit 20 in a configuration of the non-volatile memory device 1-3 illustrated in FIG. 25. Any other configuration may be substantially similar to the configuration of the non-volatile memory device 1-3 in FIG. 25. In the present embodiment as well, description is provided by taking, as an example, a non-volatile memory device using the above-described 1D1R-type resistive memory element. Further, a read method is described by taking, as an example, a case of using the above-described current application/voltage sensing method.

The compliance current control circuit 21 may be a current control circuit that changes a current-limiting value of a readout current in accordance with a change in the bit-line voltage of the selected bit line.

[5.2 Operation]

[5.2.1 Read Operation]

In the above-described fourth embodiment (FIGS. 25 and 26), description is provided on a method of changing a limiting current with use of the timing control circuit 20. In this method, it may be necessary to change the limiting current before the selective element SE is selected by timing control. When such a change is made after the selective element SE is selected, this may cause a state inversion of the memory cell MC, destruction or characteristics deterioration of the memory cell MC itself, and thus the timing control with a margin may be necessary.

The present embodiment involves a method in which a limiting current value follows a voltage of the selected bit line, and the limiting current value is brought closer to a readout limiting current value with an increase in the voltage of the selected bit line.

FIG. 28 illustrates a relationship between a bit-line voltage and a compliance current. When the voltage of the selected bit line is 0 V, the compliance current value may exhibit a maximum value. The compliance current value may come closer to a readout current value (readout compliance current Icomp) with an increase in the voltage of the selected bit line, and may become the readout current value before the voltage reaches a selected voltage of the memory cell MC. Such a method eliminates the necessity of the timing control as found in the above-described fourth embodiment, and allows charging of the selected bit line to be accelerated.

FIG. 29 illustrates the read operation in the present embodiment. In FIG. 29, a horizontal axis denotes time, and a vertical axis denotes a voltage value. The read operation in the present embodiment may be substantially similar to the read operation in the above-described third embodiment, but may be different in that a current load may change with a voltage of the selected bit line, and may change into a readout current load before the selective element SE is turned to a selected state, as illustrated in FIG. 29.

[5.3 Effects]

According to the present embodiment, a current limiting value of the readout current is changed in response to a change in a bit-line voltage of the selected bit line, which makes it possible to shorten the read time.

6. Sixth Embodiment

Next, description is provided on a sixth embodiment of the present disclosure. Hereinafter, description on any component parts having the configuration and workings similar to those of the above-described first to fifth embodiments is omitted as appropriate.

[6.1 Configuration and Operation]

The method of the address compensation in the above-described second embodiment (FIGS. 16 to 18) is also applicable to a non-volatile memory device of the voltage application/current sensing method.

As with the non-volatile memory device using the 1T1R-type resistive memory element as illustrated in FIG. 1, even in the voltage application/current sensing method (FIG. 3), it is likely that a difference in an output current value will arise due to differences in the wiring resistances $R_{BL}$ and $R_{WL}$ that are caused by addresses of the bit line BL and the word line WL to be selected. At this time, it is possible to suppress any readout error caused by the addresses by utilizing the address compensation circuit 17 in the above-described second embodiment to correct a readout reference current Iref in the voltage application/current sensing method in response to the addresses.

FIG. 30 illustrates a configuration of a reference current generator circuit with address compensation 50 that is applicable to the voltage application/current sensing method. The reference current generator circuit with address compensation 50 may include a reference current generator 51, an operational amplifier OP11, a resistor R20, an NMOS transistor T40, PMOS transistors T41 and T42, a plurality of PMOS transistors T51, T52, . . . T5$i$, and switches SW20. A gate terminal of the transistor T40 may be coupled to an output terminal of the operational amplifier OP11. Gate terminals of the transistors T41 and T42 may be coupled to each other. The switches SW20 may be provided for the respective PMOS transistors T51, T52, . . . T5$i$. The plurality of PMOS transistors T51, T52, . . . T5$i$ may be provided by the number corresponding to the number of addresses of the bit lines BL and the number of addresses of the word lines WL.

The reference current generator 51, the operational amplifier OP11, the transistor T40, and the resistor R20 may generate the readout reference current Iref. The transistors T41 and T42 may configure a current mirror circuit. An output of the transistor T42 may become the readout reference current Iref of a base when no address correction is performed. The readout reference current Iref may be corrected in accordance with addresses in such a manner that gates of the plurality of PMOS transistors T51, T52, ... T5*i* are switched by an address decoder 52, and the turned-on transistors configure the current mirror circuit together with the transistor T41.

[6.2 Effects]

According to the present embodiment, in the voltage application/current sensing method, the readout reference current Iref is changed in accordance with an placement position of the memory cell MC to be read, which makes it possible to improve readout accuracy. According to the present embodiment, it is possible to compensate for variations in the readout current for the readout address that are caused by the wiring resistances $R_{BL}$ and $R_{WL}$, and to suppress any readout error.

7. Other Embodiments

The technology achieved by the present disclosure is not limited to the description of the above-described respective embodiments, and may be modified in a variety of ways.

For example, the non-volatile memory device according to the technology is also applicable to any memory device other than the resistive memory device (ReRAM), such as a CBRAM, a PCRAM, an MRAM, and an STTRAM.

Further, for example, the technology may be configured as follows.

(1)
A non-volatile memory device including:
a plurality of bit lines;
a plurality of word lines;
a memory cell array having a plurality of memory cells each including a non-volatile storage element, one of the memory cells being disposed at each of a plurality of crossing sections of the plurality of bit lines and the plurality of word lines;
a reference voltage generator circuit that generates a readout reference voltage serving as a reference for discrimination of data values stored on the memory cells;
a readout circuit that reads the data values stored on the memory cells by detecting values of readout voltages from the memory cells relative to the readout reference voltage in a state where a predetermined current-limited readout current is applied to the bit lines; and
an address compensation circuit that changes the readout reference voltage in accordance with a placement position of a memory cell to be read of the memory cells in the readout circuit.

(2)
The non-volatile memory device according to (1), wherein the address compensation circuit includes a ladder resistor circuit having a plurality of dummy resistors corresponding to the number of the plurality of bit lines and the number of the plurality of word lines.

(3)
The non-volatile memory device according to (1) or (2), further including:
a voltage detector circuit that detects a voltage drop caused by a leakage current flowing through the plurality of bit lines and the plurality of word lines; and a leakage compensation circuit that corrects the readout reference voltage on a basis of a detection result from the voltage detector circuit.

(4)
The non-volatile memory device according to (3), wherein the voltage detector circuit has a bit-line voltage detector circuit and a word-line voltage detector circuit, the bit-line voltage detector circuit that detects a bit-line voltage at a far end for the readout circuit in each of the plurality of bit lines, and the word-line voltage detector circuit that detects a word-line voltage at a far end for the readout circuit in each of the plurality of word lines.

(5)
The non-volatile memory device according to any one of (1) to (4), further including a voltage limiter circuit that limits the readout voltage in a state where the readout current is applied up to a predetermined upper limit.

(6)
The non-volatile memory device according to any one of (1) to (5), wherein the readout circuit sets, to a ground potential, a selected bit line and a selected word line used for selection of the memory cell to be read to once discharge the selected bit line and the selected word line, and thereafter charges the selected bit line until reaching the readout voltage.

(7)
The non-volatile memory device according to (6), further including a current control circuit that changes a current limiting value of the readout current during charging of the selected bit line.

(8)
The non-volatile memory device according to (7), wherein the current control circuit includes a timing control circuit that changes the current limiting value after a lapse of a fixed amount of time after setting the selected bit line to the ground potential to discharge the selected bit line.

(9)
The non-volatile memory device according to (7), wherein the current control circuit changes the current limiting value in response to a change in a bit-line voltage of the selected bit line.

(10)
The non-volatile memory device according to any one of (1) to (9), wherein each of the non-volatile storage elements is a resistive element that stores data in accordance with a change in a resistive state.

(11)
A non-volatile memory device including:
a plurality of bit lines;
a plurality of word lines;
a memory cell array having a plurality of memory cells each including a non-volatile storage element, one of the memory cells being disposed at each of a plurality of crossing sections of the plurality of bit lines and the plurality of word lines;
a reference current generator circuit that generates a readout reference current serving as a reference for discrimination of data values stored on the memory cells;
a readout circuit that reads the data values stored on the memory cells by detecting values of readout currents from the memory cells relative to the readout reference current in a state where a predetermined readout voltage is applied to the bit lines; and
an address compensation circuit that changes the readout reference current in accordance with a placement position of a memory cell to be read of the memory cells in the readout circuit.

This application claims the priority on the basis of Japanese Patent Application No. 2014-220979 filed on Oct. 30, 2014 in Japan Patent Office, the entire contents of which are incorporated in this application by reference.

Those skilled in the art could assume various modifications, combinations, subcombinations, and changes in accordance with design requirements and other contributing factors. However, it is understood that they are included within a scope of the attached claims or the equivalents thereof.

The invention claimed is:

1. A non-volatile memory device comprising:
   a plurality of bit lines;
   a plurality of word lines;
   a memory cell array having a plurality of memory cells respectively including a non-volatile storage element and a two-terminal selective element, one of the memory cells being disposed at respective ones of a plurality of crossing sections of the plurality of bit lines and the plurality of word lines;
   a reference voltage generator circuit configured to generate a readout reference voltage serving as a reference for discrimination of data values stored on the memory cells;
   a readout circuit configured to read the data values stored on the memory cells by detecting values of readout voltages from the memory cells relative to the readout reference voltage in a state where a predetermined current-limited readout current is applied to respective two-terminal selective elements via the corresponding bit lines; and
   an address compensation circuit configured to change the readout reference voltage in accordance with a placement position of a memory cell to be read of the memory cells in the readout circuit.

2. The non-volatile memory device according to claim 1, wherein the address compensation circuit includes a ladder resistor circuit having a plurality of dummy resistors corresponding to the number of the plurality of bit lines and the number of the plurality of word lines.

3. The non-volatile memory device according to claim 1, further comprising:
   a voltage detector circuit configured to detect a voltage drop caused by a leakage current flowing through the plurality of bit lines and the plurality of word lines; and
   a leakage compensation circuit configured to correct the readout reference voltage on a basis of a detection result from the voltage detector circuit.

4. The non-volatile memory device according to claim 3, wherein the voltage detector circuit has a bit-line voltage detector circuit and a word-line voltage detector circuit, the bit-line voltage detector circuit configured to detect a bit-line voltage at a far end for the readout circuit in each of the plurality of bit lines, and the word-line voltage detector circuit configured to detect a word-line voltage at a far end for the readout circuit in each of the plurality of word lines.

5. The non-volatile memory device according to claim 1, further comprising a voltage limiter circuit configured to limit the readout voltage in a state where the readout current is applied up to a predetermined upper limit.

6. The non-volatile memory device according to claim 1, wherein the readout circuit sets, to a ground potential, a selected bit line and a selected word line used for selection of the memory cell to be read to once discharge the selected bit line and the selected word line, and thereafter charges the selected bit line until reaching the readout voltage.

7. The non-volatile memory device according to claim 6, further comprising a current control circuit configured to change a current limiting value of the readout current during charging of the selected bit line.

8. The non-volatile memory device according to claim 7, wherein the current control circuit includes a timing control circuit configured to change the current limiting value after a lapse of a fixed amount of time after setting the selected bit line to the ground potential to discharge the selected bit line.

9. The non-volatile memory device according to claim 7, wherein the current control circuit changes the current limiting value in response to a change in a bit-line voltage of the selected bit line.

10. The non-volatile memory device according to claim 1, wherein each of the non-volatile storage elements is a resistive element that stores data in accordance with a change in a resistive state.

11. The non-volatile memory device according to claim 10, wherein each of the two-terminal selective elements is a diode.

12. The non-volatile memory device according to claim 11 wherein, in each of the memory cells, the resistive element and the diode are connected in series between the corresponding bit line and the corresponding word line.

13. The non-volatile memory device according to claim 1, wherein the placement position includes a bit line address and a word line address, and wherein the address compensation circuit changes the readout reference voltage in accordance with both the bit line address and the word line address of the memory cell to be read.

14. A non-volatile memory device comprising:
   a plurality of bit lines;
   a plurality of word lines;
   a memory cell array having a plurality of memory cells respectively including a non-volatile storage element and a two-terminal selective element, one of the memory cells being disposed at respective ones of a plurality of crossing sections of the plurality of bit lines and the plurality of word lines;
   a reference current generator circuit configured to generate a readout reference current serving as a reference for discrimination of data values stored on the memory cells;
   a readout circuit configured to read the data values stored on the memory cells by detecting values of readout currents from the memory cells relative to the readout reference current in a state where a predetermined readout voltage is applied to respective two-terminal selective elements via the corresponding bit lines; and
   an address compensation circuit configured to change the readout reference current in accordance with a placement position of a memory cell to be read of the memory cells in the readout circuit.

15. A non-volatile memory device comprising:
   a plurality of bit lines;
   a plurality of word lines;
   a memory cell array having a plurality of memory cells respectively including a non-volatile storage element and a two-terminal selective element, one of the memory cells being disposed at respective ones of a plurality of crossing sections of the plurality of bit lines and the plurality of word lines;
   a reference voltage generator circuit configured to generate a readout reference voltage serving as a reference for discrimination of data values stored on the memory cells;
   a readout circuit configured to read the data values stored on the memory cells by detecting values of readout voltages from the memory cells relative to the readout reference voltage in a state where a predetermined current-limited readout current is applied to respective two-terminal selective elements via the corresponding bit lines; and an address compensation circuit configured to change the readout reference voltage in accordance with a bit line address and a word line address of a memory cell to be read of the memory cells in the readout circuit.

* * * * *